(12) United States Patent
Shokrollahi et al.

(10) Patent No.: US 7,956,772 B2
(45) Date of Patent: Jun. 7, 2011

(54) METHODS AND APPARATUS EMPLOYING FEC CODES WITH PERMANENT INACTIVATION OF SYMBOLS FOR ENCODING AND DECODING PROCESSES

(75) Inventors: Mohammad Amin Shokrollahi, Preverenges (CH); Michael Luby, Berkeley, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/604,773

(22) Filed: Oct. 23, 2009

(65) Prior Publication Data
US 2010/0103001 A1    Apr. 29, 2010

Related U.S. Application Data

(63) Continuation of application No. 11/842,102, filed on Aug. 20, 2007, now Pat. No. 7,633,413.

(60) Provisional application No. 61/235,285, filed on Aug. 19, 2009.

(51) Int. Cl.
*H03M 7/34* (2006.01)

(52) U.S. Cl. .............. 341/51; 341/50; 341/94; 714/746; 714/751; 714/752; 714/786

(58) Field of Classification Search ............ 341/50–107; 714/746, 751, 752, 786
See application file for complete search history.

(56) References Cited

U.S. PATENT DOCUMENTS

| | | | |
|---|---|---|---|
| 6,307,487 B1 | 10/2001 | Luby | |
| 6,320,520 B1 | 11/2001 | Luby | |
| 6,411,223 B1 * | 6/2002 | Haken et al. | 341/50 |
| 6,614,366 B2 * | 9/2003 | Luby | 341/50 |
| 6,618,451 B1 * | 9/2003 | Gonikberg | 375/341 |
| 6,856,263 B2 | 2/2005 | Shokrollahi et al. | |
| 6,909,383 B2 | 6/2005 | Shokrollahi et al. | |
| 7,057,534 B2 * | 6/2006 | Luby | 341/50 |
| 7,068,729 B2 * | 6/2006 | Shokrollahi et al. | 375/296 |
| 7,072,971 B2 * | 7/2006 | Lassen et al. | 709/230 |
| 7,233,264 B2 * | 6/2007 | Luby | 341/50 |
| 7,293,222 B2 * | 11/2007 | Shokrollahi et al. | 714/777 |
| 7,512,697 B2 * | 3/2009 | Lassen et al. | 709/230 |
| 7,644,335 B2 | 1/2010 | Luby et al. | |
| 7,721,184 B2 * | 5/2010 | Luby et al. | 714/781 |
| 2007/0195894 A1 | 8/2007 | Shokrollahi et al. | |
| 2009/0067551 A1 * | 3/2009 | Chen et al. | 375/340 |
| 2009/0204877 A1 * | 8/2009 | Betts | 714/806 |

* cited by examiner

*Primary Examiner* — Linh V Nguyen
(74) *Attorney, Agent, or Firm* — Jeffrey D. Jacobs

(57) ABSTRACT

A method of encoding data for transmission from a source to a destination over a communications channel is provided. A plurality of encoded symbols are generated from a set of input symbols including source symbols and redundant symbols, wherein the input symbols are organized such that at least one of the input symbols is not used for a first encoding process, so that it is permanently inactivated for the purposes of scheduling a decoding process. A method of decoding data is also provided, wherein encoded symbols generated from a set of input symbols are used to recover source symbols, wherein the input symbols are organized such that at least one of the input symbols is not used for a first decoding process, so that it is permanently inactivated for the purpose of scheduling the decoding process.

34 Claims, 21 Drawing Sheets

Fig. 3

| d | m[d] |
|---:|---:|
| 30 | 1048576 |
| 29 | 1017662 |
| 28 | 1016370 |
| 27 | 1014983 |
| 26 | 1013490 |
| 25 | 1011876 |
| 24 | 1010129 |
| 23 | 1008229 |
| 22 | 1006157 |
| 21 | 1003887 |
| 20 | 1001391 |
| 19 | 998631 |
| 18 | 995565 |
| 17 | 992138 |
| 16 | 988283 |
| 15 | 983914 |
| 14 | 978921 |
| 13 | 973160 |
| 12 | 966438 |
| 11 | 958494 |
| 10 | 948962 |
| 9 | 937311 |
| 8 | 922747 |
| 7 | 904023 |
| 6 | 879057 |
| 5 | 844104 |
| 4 | 791675 |
| 3 | 704294 |
| 2 | 529531 |
| 1 | 5243 |
| 0 | 0 |

Fig. 8

$$\begin{pmatrix} C & I_\ell & 0 \\ H & & I_h \end{pmatrix} \begin{pmatrix} v_1 \\ v_2 \\ \vdots \\ v_{\ell-1} \\ v_\ell \\ \hline u_1 \\ \vdots \\ u_h \end{pmatrix} \begin{pmatrix} x \\ y \\ z \end{pmatrix} = \begin{pmatrix} 0 \\ \vdots \\ 0 \end{pmatrix}$$

Fig. 10

$$\begin{pmatrix} T & & \\ C & I_\ell & 0 \\ H & & I_h \end{pmatrix} \begin{pmatrix} \mu_1 \\ \mu_2 \\ \vdots \\ \vdots \\ \vdots \\ \mu_{N-1} \\ \mu_N \\ \hline v_1 \\ v_2 \\ \vdots \\ v_{\ell-1} \\ v_\ell \\ \hline u_1 \\ \vdots \\ u_h \end{pmatrix} \begin{pmatrix} x \\ y \\ z \end{pmatrix} = \begin{pmatrix} s_1 \\ s_2 \\ \vdots \\ s_{N-1} \\ s_N \\ \hline 0 \\ \vdots \\ 0 \end{pmatrix}$$

$v = u$ $\tau_{j1}$
$\vdots$
$\tau_{jN+\ell}$

$v = q$ $\hat{\tau}_1$
$\vdots$ $I_b$, $\hat{S}$, $0$, $V$ $$\left[ \begin{array}{c|ccc} & \hat{\tau}_1 \\ & \vdots \\ I_b & \hat{S} & \vdots \\ & \vdots \\ & \vdots \end{array} \right] \cdot \begin{pmatrix} v_1 \\ v_2 \end{pmatrix} = q_1$$

Fig. 12(c)

$$L \cdot v_1 = q_3 \oplus \left[ \begin{array}{c|c} & \tau_{j_1} \\ S & \vdots \\ & \tau_{j_b} \end{array} \right] \cdot v_2$$

Fig. 12(d)

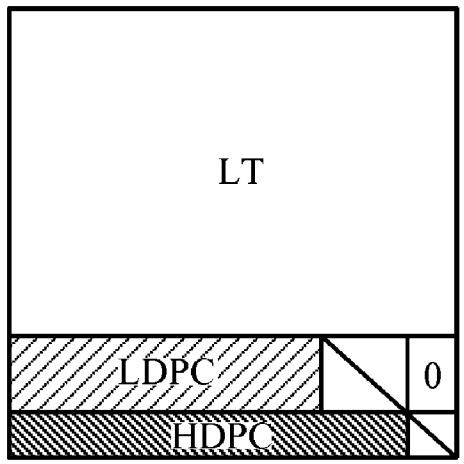
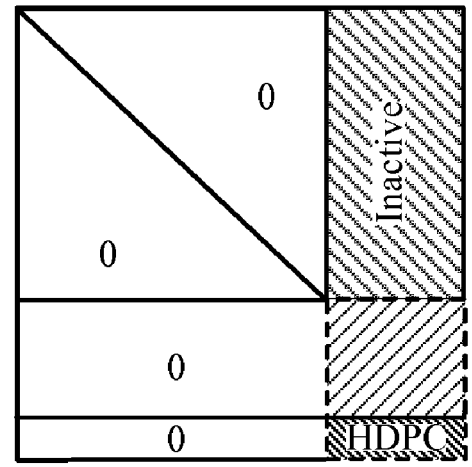
Fig. 13(a)　　　　　　　　Fig. 13(b)
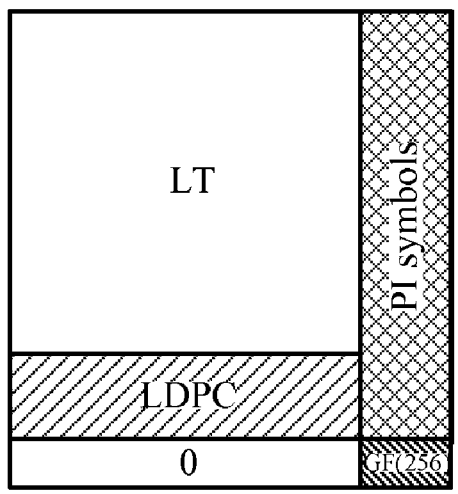
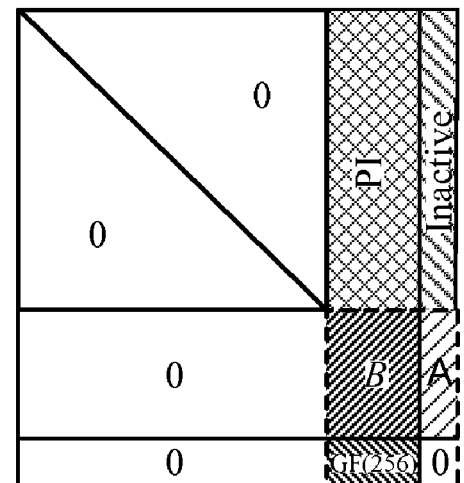
Fig. 13(c)　　　　　　　　Fig. 13(d)

| | | | | | | | | | |
|---|---|---|---|---|---|---|---|---|---|
| 0 | 0 | 1 | 0 | 1 | 0 | 1 | 0 | 1 | 0 | 1 |
| 1 | <u>1</u> | 1 | 0 | 1 | 0 | 1 | 0 | 1 | 0 | 1 |
| 2 | 1 | <u>0</u> | 0 | 1 | 0 | 1 | 0 | 1 | 0 | 1 |
| 3 | 1 | 0 | <u>1</u> | 1 | 0 | 1 | 0 | 1 | 0 | 1 |
| 4 | 1 | 0 | 1 | <u>0</u> | 0 | 1 | 0 | 1 | 0 | 1 |
| 5 | 1 | 0 | 1 | 0 | <u>1</u> | 1 | 0 | 1 | 0 | 1 |
| 6 | 1 | 0 | 1 | 0 | 1 | <u>0</u> | 0 | 1 | 0 | 1 |
| 7 | 1 | 0 | 1 | 0 | 1 | 0 | <u>1</u> | 1 | 0 | 1 |
| 8 | 1 | 0 | 1 | 0 | 1 | 0 | 1 | <u>0</u> | 0 | 1 |
| 9 | 1 | 0 | 1 | 0 | 1 | 0 | 1 | 0 | <u>1</u> | 1 |
| 10 | 1 | 0 | 1 | 0 | 1 | 0 | 1 | 0 | 1 | <u>0</u> |
| 11 | 0 | 1 | 0 | 1 | 0 | 1 | 0 | 1 | 0 | 1 |
| ... | ... | ... | ... | ... | ... | ... | ... | ... | ... | ... |

Fig. 14

METHOD: BasicParameters (* Computes the basic parameters for the encoder and the decoder *)

```
1.    nSrcSym ← (SrcBlkSize + SymbolSize-1)/SymbolSize
2.    nPISymbols ← 2
3.    WHILE nPISymbols * nPISymbols < 10 * nSrcSym
4.         do ++nPISymbols
5.    X ← 2
6.    WHILE X * (X-1)< 2 * (nSrcSym - nPISymbols )
7.         DO ++X
8.    nLDPC ← nextprime(((nSrcSym - nPISymbols)+99)/100+X)
9.    nHDPC ← 5+(5*(nSrcSym - nPISymbols-1000)/(50000-1000))
10.   nInp ← nSrcSym + nLDPC + nHDPC - nPISymbols
11.   nP ← nextprime(nInp)
```

Fig. 15

METHOD EncoderInitialization (* Initializes the encoder *)

```
1.    H[0] ← 0
2.    FOR i ← 0 TO floor(nPISymbols/2)-1
3.          DO H[0] ←H[0] ⊕ Src[nInp + 2i + 1]
4.    FOR i← 1 TO nPISymbols
5.          DO H[i] ←H[i-1] ⊕ Src[nInp+i-1]
```

Fig. 16

METHOD Encode (* Encodes symbol with ESI $E$ and stores it into Symb *)

```
1.    Symb ← 0
2.    (a, b, w) ← ESIToTriple(E)
3.    c ← FirstNgbr(a, b, w)
4.    Symb ← Symb ⊕ Src[c]
5.    FOR i ← 1 TO w - 1
6.          DO c ← NextNgbr(a, b, w, c)
7.                Symb ← Symb ⊕ Src[c]
8.    Symb ← Symb ⊕ H[E mod nPISymbols + 1]
```

Fig. 17

METHOD InitInactMatrix (* Initializes the inactivation matrix *)

```
1.    u[0] ← x
2.    for i ← 1 to nPISymbols
3.          do u[i] ← u[i - 1]
4.             Toggle entry I - 1 of u[i]
5.    for i ← 0 to nLDPC + nHDPC - 1
6.          do IntactMat[i + nDynamic] ← u[i mod(nPISymbols + 1)]
7.    for i ←0 to nDynamic - 1
8.          do IntactMat[i] ← u[E [i]mod(nPISymbols + 1)]
```

Fig. 18

| 0  | 0 | 1 | 0 | 1 | 0 | 1 | 0 | 1 | 0 | 1 |
|----|---|---|---|---|---|---|---|---|---|---|
| 1  | <u>1</u> | 1 | 0 | 1 | 0 | 1 | 0 | 1 | 0 | 1 |
| 2  | 1 | <u>0</u> | 0 | 1 | 0 | 1 | 0 | 1 | 0 | 1 |
| 3  | 1 | 0 | <u>1</u> | 1 | 0 | 1 | 0 | 1 | 0 | 1 |
| 4  | 1 | 0 | 1 | <u>0</u> | 0 | 1 | 0 | 1 | 0 | 1 |
| 5  | 1 | 0 | 1 | 0 | <u>1</u> | 1 | 0 | 1 | 0 | 1 |
| 6  | 1 | 0 | 1 | 0 | 1 | <u>0</u> | 0 | 1 | 0 | 1 |
| 7  | 1 | 0 | 1 | 0 | 1 | 0 | <u>1</u> | 1 | 0 | 1 |
| 8  | 1 | 0 | 1 | 0 | 1 | 0 | 1 | <u>0</u> | 0 | 1 |
| 9  | 1 | 0 | 1 | 0 | 1 | 0 | 1 | 0 | <u>1</u> | 1 |
| 10 | 1 | 0 | 1 | 0 | 1 | 0 | 1 | 0 | 1 | <u>0</u> |
| 11 | 0 | 1 | 0 | 1 | 0 | 1 | 0 | 1 | 0 | 1 |
| ... | ... | ... | ... | ... | ... | ... | ... | ... | ... | ... |

Fig. 19

METHOD CalculateSchedule (* Calculates the schedule *)

```
1.    while ( nRecovered + nInactive < nLnp + nPISymbols )
2.       do while ripple is not empty
3.          do discharge top element OSIndex from ripple
4.             RemoveUniqueNeighbor( OSIndex)
5.          if (nRecovered + nInactive < nLnp + nPISymbols)
6.             then Inactive()
7.    Process remaining non HDPC output symbols
8.    Set up matrix and solve
9.    if matrix is not full rank
10.      then process NDPC symbols
11.         Set up matrix and solve
12.   if matrix is still not full rank
13.      then return ERROR
14.      else return inverse matrix
```

Fig. 20

METHOD: ForwardSubstitution (* Prepares the output symbols for the recovery of the inactive input symbols *)

```
1.    for i ← 0 to Recovered - 1
2.       do OSIndex ← OSOrder[i]
3.          for ngbr being a neighbor of OSIndex
4.             do if ngbr is not inactive, and not InpOrder[i]
5.                then z_{OSOrder[i]} ← z_{OSOrder[i]} ⊕ z_{ngbr}
6.    for i ← 0 to nInactive - 1
7.       do OSIndex ← rowmask[i]
8.          for ngbr being a neighbor of OSIndex
9.             do if ngbr is not inactive, and not InpOrder[i]
10.               then z_{OSOrder[i]} ← z_{OSOrder[i]} ⊕ z_{ngbr}
```

Fig. 21

METHOD InactiveSymbolsRecovery (* Recovers the values of the inactive input symbols *)

```
1.      for i ← 0 to nInactive - 1
2.         do τ_i ← 0
3.            for j ← 0 to nInactive - 1
4.               do τ_i ← τ_i ← ⊕M[i][j] * z_rowmask[j]
```

Fig. 22

METHOD: IncorporateAdditionalInactive (* Incorporates the additional inactive symbols into the output symbols *)

```
1.  for i ← 0 to Recovered - 1
2.    do for j ← to 0 nInactive - nPISymbols - 1
3.       do z_OSOrder[i] ← z_OSOrder[i]⊕ InactMat[OSOrder[i]][j] * τ_nPISymbols+ j
```

Fig. 23

METHOD: BackSubstitute (* Back substitution of the output symbols *)

```
1.    for i ← Recovered - 1 to 0
2.       do OSIndex ← OSOrder[i]
3.          for ngbr in the list of neighbors of OSIndex
4.             do if ngbr is not InpOrder[i] and ngbr is not inactive
5.                then z_OSOrder[i] ← z_OSOrder[i]⊕ z_ngbr
```

Fig. 24

METHOD: ProcessPISymbols (* Processes the permanently inactive symbols and adds them into the output symbols *)

1.     for $i \leftarrow 0$ to Recovered $- 1$
2.          do $z_{\text{OSOrder}[i]} \leftarrow z_{\text{OSOrder}[i]} \oplus H[E[\text{OSOrder}[i]]]$

Fig. 25

```
METHOD: ForwardPass
(* Forward substitution of the output symbols *)
1.    for i ← 0 to Recovered - 1
2.        do OSIndex ← to OSOrder[i]
3.           for ngbr in the list of neighbors
4.               do if ngbr ≠ InpOrder[i] and ngbr is not inactive
5.                   then z_OSOrder[i] ← z_OSOrder[i] ⊕ z_ngbr
```

Fig. 26

METHODS AND APPARATUS EMPLOYING FEC CODES WITH PERMANENT INACTIVATION OF SYMBOLS FOR ENCODING AND DECODING PROCESSES

CLAIM OF PRIORITY UNDER 35 U.S.C. §119

The present Application for Patent claims priority to Provisional Application No. 61/235,285 entitled "METHODS AND APPARATUS EMPLOYING FEC CODES WITH PERMANENT INACTIVATION OF SYMBOLS FOR ENCODING AND DECODING PROCESSES" filed Aug. 19, 2009, and assigned to the assignee hereof and hereby expressly incorporated by reference herein.

CROSS REFERENCES

The following references are herein incorporated by reference in their entirety for all purposes:

1) U.S. Pat. No. 6,307,487 issued to Michael G. Luby entitled "Information Additive Code Generator and Decoder for Communication Systems" (hereinafter "Luby I");

2) U.S. Pat. No. 6,320,520 issued to Michael G. Luby entitled "Information Additive Group Code Generator and Decoder for Communication Systems" (hereinafter "Luby II");

3) U.S. Pat. No. 7,068,729 issued to M. Amin Shokrollahi entitled "Multi-Stage Code Generator and Decoder for Communication Systems" (hereinafter "Shokrollahi I");

4) U.S. Pat. No. 6,856,263 issued to M. Amin Shokrollahi entitled "Systems and Processes for Decoding a Chain Reaction Code Through Inactivation" (hereinafter "Shokrollahi II");

5) U.S. Pat. No. 6,909,383, issued to M. Amin Shokrollahi entitled "Systematic Encoding and Decoding of Chain Reaction Codes" (hereafter "Shokrollahi III");

6) U.S. Patent Publication No. 2006/0280254 naming Michael G. Luby and M. Amin Shokrollahi and entitled "In-Place Transformations with Applications to Encoding and Decoding Various Classes of Codes" (hereafter "Luby III"); and 7) U.S. Patent Publication No. 2007/0195894 naming M. Amin Shokrollahi and entitled "Multiple-Field Based Code Generator and Decoder for Communications Systems" (hereafter "Shokrollahi IV").

FIELD OF THE INVENTION

The present invention relates to encoding and decoding data in communications systems and more specifically to communication systems that encode and decode data to account for errors and gaps in communicated data in an efficient manner.

BACKGROUND OF THE INVENTION

Techniques for transmission of files between a sender and a recipient over a communications channel are the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

As used herein, "source data" refers to data that is available at one or more senders and that a receiver is used to obtain, by recovery from a transmitted sequence with or without errors and/or erasures, etc. As used herein, "encoded data" refers to data that is conveyed and can be used to recover or obtain the source data. In a simple case, the encoded data is a copy of the source data, but if the received encoded data differs (due to errors and/or erasures) from the transmitted encoded data, in this simple case the source data might not be entirely recoverable absent additional data about the source data. Transmission can be through space or time. In a more complex case, the encoded data is generated based on source data in a transformation and is transmitted from one or more senders to receivers. The encoding is said to be "systematic" if the source data is found to be part of the encoded data. In a simple example of systematic encoding, redundant information about the source data is appended to the end of the source data to form the encoded data.

Also as used herein, "input data" refers to data that is present at an input of an FEC (forward-error correcting) encoder apparatus or an FEC encoder module, component, step, etc., ("FEC encoder") and "output data" refers to data that is present at an output of an FEC encoder. Correspondingly, output data would be expected to be present at an input of an FEC decoder and the FEC decoder would be expected to output the input data, or a correspondence thereof, based on the output data it processed. In some cases, the input data is, or includes, the source data, and in some cases, the output data is, or includes, the encoded data. In other cases, a sender device or sender program code may comprise more than one FEC encoder, i.e., source data is transformed into encoded data in a series of a plurality of FEC encoders. Similarly at the receiver, there may be more than one FEC decoder applied to generate source data from received encoded data.

Data can be thought of as partitioned into symbols. An encoder is a computer system, device, electronic circuit, or the like, that generates encoded symbols or output symbols from a sequence of source symbols or input symbols and a decoder is the counterpart that recovers a sequence of source symbols or input symbols from received or recovered encoded symbols or output symbols. The encoder and decoder are separated in time and/or space by the channel and any received encoded symbols might not be exactly the same as corresponding transmitted encoded symbols and they might not be received in exactly the same sequence as they were transmitted. The "size" of a symbol can be measured in bits, whether or not the symbol is actually broken into a bit stream, where a symbol has a size of M bits when the symbol is selected from an alphabet of $2^M$ symbols. In many of the examples herein, symbols are measured in bytes and codes might be over a field of 256 possibilities (there are 256 possible 8-bit patterns), but it should be understood that different units of data measurement can be used and it is well-known to measure data in various ways.

Luby I describes the use of codes, such as chain reaction codes, to address error correction in a compute-efficient, memory-efficient and bandwidth-efficient manner. One property of the encoded symbols produced by a chain reaction encoder is that a receiver is able to recover the original file as soon as enough encoded symbols have been received. Specifically, to recover the original K source symbols with a high probability, the receiver needs approximately K+A encoded symbols.

The "absolute reception overhead" for a given situation is represented by the value A, while a "relative reception overhead" can be calculated as the ratio A/K. The absolute reception overhead is a measure of how much extra data needs to be received beyond the information theoretic minimal amount of data, and it may depend on the reliability of the decoder and may vary as a function of the number, K, of source symbols. Similarly, the relative reception overhead, A/K, is a measure of how much extra data needs to be received beyond the information theoretic minimal amount of data relative to the size of the source data being recovered, and also may depend on the reliability of the decoder and may vary as a function of the number K of source symbols.

Chain reaction codes are extremely useful for communication over a packet based network. However, they can be fairly computationally intensive at times. A decoder might be able to decode more often, or more easily, if the source symbols are encoded using a static encoder prior to a dynamic encoder that encodes using a chain reaction or another rateless code. Such decoders are shown in Shokrollahi I, for example. In examples shown there, source symbols are input symbols to a static encoder that produces output symbols that are input symbols to a dynamic encoder that produces output symbols that are the encoded symbols, wherein the dynamic encoder is a rateless encoder that that can generate a number of output symbols in a quantity that is not a fixed rate relative to the number of input symbols. The static encoder might include more than one fixed rate encoder. For example a static encoder might include a Hamming encoder, an LDPC encoder, an HDPC encoder, and/or the like.

Chain reaction codes have a property that as some symbols are recovered at the decoder from the received symbols, those symbols might be able to be used to recover additional symbols, which in turn might be used to recover yet more symbols. Preferably, the chain reaction of symbol solving at the decoder can continue such that all of the desired symbols are recovered before the pool of received symbols is used up. Preferably, the computational complexity of performing chain reaction encoding and decoding processes is low.

A recovery process at the decoder might involve determining which symbols were received, creating a matrix that would map the original input symbols to those output symbols that were received, then inverting the matrix and performing a matrix multiplication of the inverted matrix and a vector of the received output symbols. In a typical system, a brute force implementation of this can consume excessive computing effort and memory requirements. Of course, for a particular set of received output symbols, it might be impossible to recover all of the original input symbols, but even where it is possible, it might be very computationally expensive to compute the result.

Shokrollahi II describes an approach called "inactivation", wherein decoding occurs in two steps. In the first step, the decoder takes stock of what received output symbols it has available, what the matrix might look like and determines, at least approximately, a sequence of decoding steps that would allow for the chain reaction process to complete given the received output symbols. In the second step, the decoder runs the chain reaction decoding according to the determined sequence of decoding steps. This can be done in a memory-efficient manner (i.e., a manner that requires less memory storage for the operation than a more memory-inefficient process).

In an inactivation approach, the first decoding step involves manipulating the matrix, or its equivalent, to determine some number of input symbols that can be solved for and when the determination stalls, designating one of the input symbols as an "inactivated symbol" and continue the determination process assuming that the inactivated symbol is indeed solved, then at the end, solving for the inactivated symbols using Gaussian elimination or some other method to invert a matrix that is much smaller than the original decoding matrix. Using that determination, the chain reaction sequence can be performed on the received output symbols to arrive at the recovered input symbols, which can either be all of the original input symbols or a suitable set of the original input symbols.

For some applications that impose tight constraints on the decoder, such as where the decoder is in a low-power device with limited memory and computing power, or such as when there are tight constraints on the allowable absolute or relative reception overhead, improved methods might be indicated relative to the inactivation approach described above.

BRIEF SUMMARY OF THE INVENTION

According to one embodiment of the invention, a method of decoding an ordered set of source symbols from a set of encoded symbols received over a communications channel from one or more transmitters, wherein the encoded symbols are generated from the ordered set of source symbols. Source symbols are converted to input symbols, which are used for encoding and decoding, to provide improved characteristics, or the input symbols could be a copy of the source symbols. Input symbols are used to generate redundant symbols, which might be chain reaction symbols, LDPC symbols, HDPC symbols or other types of redundant symbols. Collectively, the input symbols and the redundant symbols for a combined set that is used to generate encoded symbols, but at least one of the symbols in the combined set is designated a permanently inactivated symbol, wherein there is at least one input symbol among the permanently inactivated symbols and there is at least one input symbol that is not among the permanently inactivated symbols. In decoding, decoding steps are scheduled, setting aside the scheduling of permanently inactivated symbols, which can then be solved using novel or conventional methods and used in solving for the other received symbols. One approach to solving for the permanent inactivated symbols (and other on-the-fly inactivations, if used) might be by applying Gaussian elimination to solve for the inactivated symbols. Some of the remaining input symbols are recovered based on the values of the recovered permanently inactivated symbols and the output symbols.

There are many variants. In one variant, a plurality of redundant symbols is first generated from the source symbols and then the input symbols comprise the source symbols and the plurality of redundant symbols. In another variant, a decoding method is first applied to the source symbols to generate the input symbols. In another variant, the number of encoded symbols that can be generated is independent of the number of source symbols.

Corresponding encoding methods are also provided. According to one embodiment, a method includes transmitting an ordered set of source symbols from one or more senders to one or more receivers over a communications channel, wherein the data to be sent includes a plurality of encoded symbols generated from the source symbols. In this embodiment, input symbols comprise the source symbols and output symbols comprise received encoded symbols. In a first step, the input symbols are partitioned into a first set of input symbols and a second set of input symbols, wherein there is at least one input symbol in the first set of input symbols and there is at least one input symbol in the second set of input symbols. In another step, values are generated for a first set and a second set of temporary symbols, wherein the values of the first set of temporary symbols depend on the values of the first set of input symbols and the values for the second set of temporary symbols depend on the values of the second set of input values. In another step, the values for encoded symbols are generated from the first set and the second set of temporary symbols.

There are many variant embodiments of this encoding method. In one variant, a plurality of redundant symbols is first generated from the source symbols and then the input symbols comprise the source symbols and the plurality of redundant symbols. In another variant, a decoding method is first applied to the source symbols to generate the input symbols. In another variant, the number of encoded symbols that can be generated is independent of the number of source symbols.

The methods and systems can be implemented by electronic circuits or by a processing device that executes programming instructions and has the appropriate instruction program code to implement encoding and/or decoding.

Numerous benefits are achieved by way of the present invention. For example, in a specific embodiment, the computational expense of encoding data for transmission over a channel is reduced. In another specific embodiment, the computational expense of decoding such data is reduced. In another specific embodiment, the absolute and relative reception overhead is substantially reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

BRIEF DESCRIPTION OF THE DRAWINGS

FIG. 3 is an illustration of a matrix operation that represents operations to solve for recovered source symbols based on received encoded symbols.

FIG. 8 illustrates an example degree distribution lookup table that might be used to set the number of neighbors an output symbol might have.

FIG. 10 is an illustration of a matrix operation that an encoder or decoder would do to map input symbols to output symbols using LDPC encoding and HDPC encoding.

FIG. 11 is an illustration of a matrix operation usable to represent a set of linear equations that a decoder is to solve to for source symbols.

FIG. 12 illustrates various forms of matrix operations; FIG. 12(a) illustrates a decoding matrix for a permanent inactivation decoding process, FIG. 12(b) illustrates the decoding matrix after a first set of matrix transformations, FIG. 12(c) illustrates an alternative decoding matrix format, and FIG. 12(d) illustrates further processing.

FIG. 13 illustrates simplified representations of decoding matrices; FIG. 13(a) shows a decoding matrix for OTF before elimination; FIG. 13(b) shows the decoding matrix for OTF after elimination, up to row/column permutation; FIG. 13(c) is the decoding matrix for permanent inactivation before elimination and FIG. 13(d) is the decoding matrix for permanent inactivation after elimination, up to row and column permutations.

FIG. 14 illustrates a structure of a non-HDPC part of permanently inactivated symbols for the case t=10.

FIGS. 15-18 and 20-26 illustrate examples of program code that might be executed by a processor, or used as pseudocode to generate code, to perform various operations in an encoder and/or a decoder.

FIG. 19 illustrates an example of a matrix used by one or more process;

Figure 1:
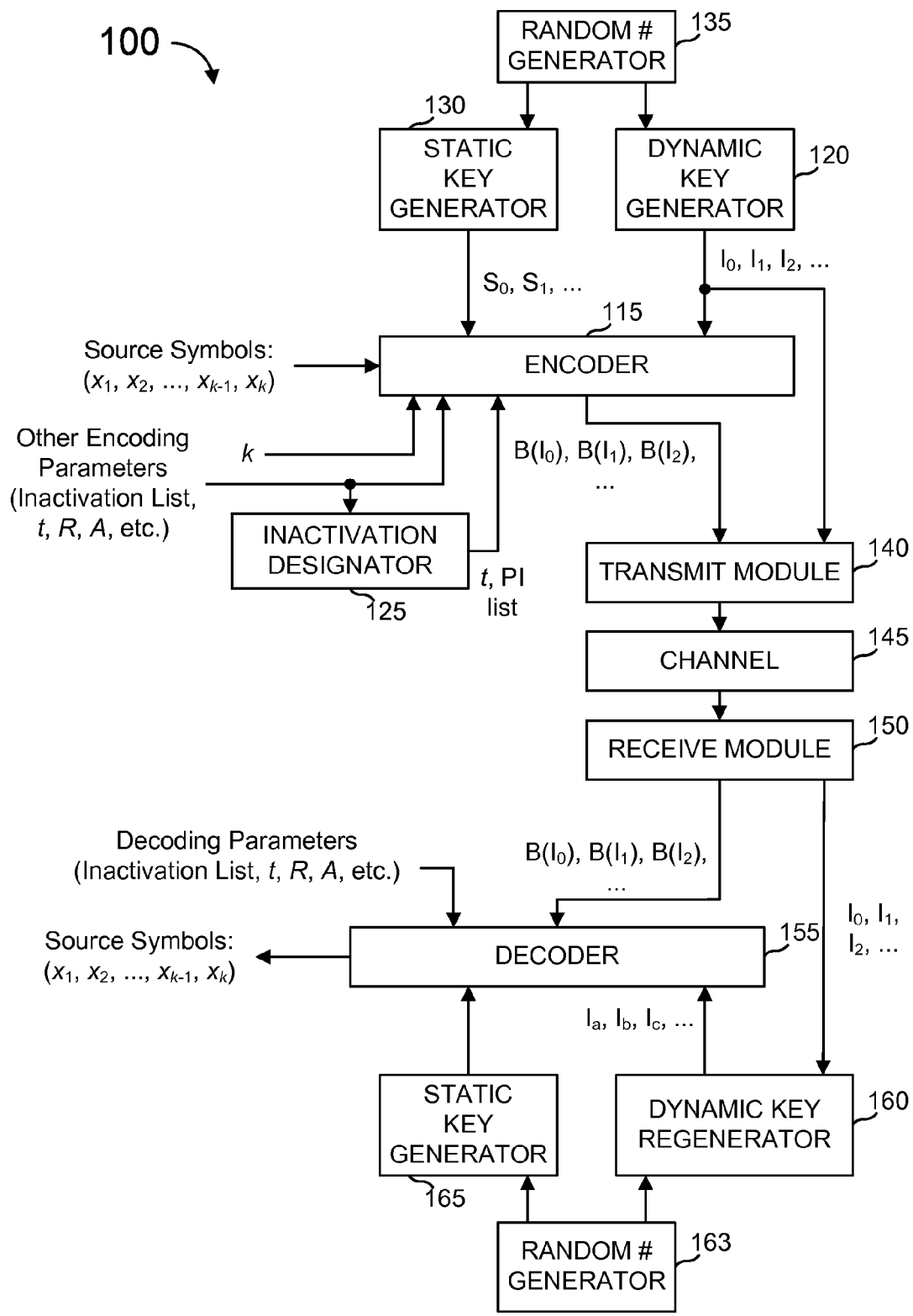
FIG. 1 is a block diagram of a communications system according to one embodiment of the present invention.

Attached as Appendix A is a code specification for a specific embodiment of an encoder/decoder system, which also includes a specification of how a systematic encoder/decoder embodiment of the present invention might be used in an object delivery transport embodiment of the present invention.

DETAILED DESCRIPTION OF SPECIFIC EMBODIMENTS

Details for implementing portions of encoders and decoders that are referenced herein are provided by Luby I, Luby II, Shokrollahi I, Shokrollahi II, Shokrollahi III, Luby III, and Shokrollahi IV and are not entirely repeated here for the sake of brevity. The entire disclosures of those are herein incorporated by reference for all purposes and it is to be understood that the implementations therein are not required of the present invention, and many other variations, modifications, or alternatives can also be used, unless otherwise indicated.

Multi-stage encoding, as described herein, encodes the source data in a plurality of stages. Typically, but not always, a first stage adds a predetermined amount of redundancy to the source data. A second stage then uses a chain reaction code, or the like, to produce output symbols from the original source data and the redundant symbols computed by the first stage of the encoding. In one specific embodiment of the present invention, the received data is first decoded using a chain reaction decoding process. If that process is not successful in recovering the original data completely, a second decoding step can be applied.

Some of the embodiments taught herein can be applied to many other types of codes, for example to the codes as described in the Internet Engineering Task Force (IETF) Request for Comments (RFC) 5170 (hereinafter "IETF LDPC codes"), and to the codes described in U.S. Pat. Nos. 6,073,250, 6,081,909 and 6,163,870 (hereinafter "Tornado codes"), resulting in improvements in reliability and/or CPU and/or memory performance for those types of codes.

One advantage of some embodiments taught herein, is that fewer arithmetic operations are necessary to produce output symbols, as compared to chain reaction coding alone. Another advantage of some specific embodiments that include a first stage of encoding and a second stage of encoding is that the first stage of encoding and the second stage of encoding can be done at separate times and/or by separate devices, thus partitioning the computational load and minimizing the overall computational load and also the memory size and access pattern requirements. In embodiments of multi-stage encoding, redundant symbols are generated from the input file during the first stage of encoding. In these embodiments, in the second stage of encoding, output symbols are generated from the combination of the input file and the redundant symbols. In some of these embodiments, the output symbols can be generated as needed. In embodiments in which the second stage comprises chain reaction encoding, each output symbol can be generated without regard to how other output symbols are generated. Once generated, these output symbols can then be placed into packets and transmitted to their destination, with each packet containing one or more output symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value. A "file" may also be used to refer to a short portion of a streaming source, i.e., the stream of data may be partitioned into one second intervals, and the block of source data within each such one second interval may be considered to be a "file". As another example, the blocks of data from a video streaming source may be further partitioned into multiple parts based on priorities of that data defined for example by a video system that can playout the video stream, and each part of each block may be considered to be a "file". Thus, the term "file" is used generally and is not intended to be extensively limiting.

Transmission is the process of transmitting data from one or more senders to one or more recipients through a channel in order to deliver a file. A sender is also sometimes referred to as the encoder. If one sender is connected to any number of recipients by a perfect channel, the received data can be an exact copy of the source file, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing a source file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file, but instead to transmit data generated from the input file that assists with recovery of erasures. An encoder is a circuit, device, module or code segment that handles that task. One way of viewing the operation of the encoder is that the encoder generates output symbols from input symbols, where a sequence of input symbol values represent the input file. Each input symbol would thus have a position, in the input file, and a value. A decoder is a circuit, device, module or code segment that reconstructs the input symbols from the output symbols received by the recipient. In multi-stage coding, the encoder and the decoder are sometimes further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of input symbols, wherein the number of redundant symbols is determined prior to encoding. Examples of static encoding codes include Reed-Solomon codes, Tornado codes, Hamming codes, Low Density Parity Check (LDPC) codes such as the IETF LDPC codes, etc. The term "static decoder" is used herein to refer to a decoder that can decode data that was encoded by a static encoder.

As used herein, a "dynamic encoder" is an encoder that generates output symbols from a set of input symbols, where the number of possible output symbols is independent of the number of input symbols, and where the number of output symbols to be generated need not be fixed. One example of a dynamic encoder is a chain reaction encoder, such as the encoders taught in Luby I and Luby II. The term "dynamic decoder" is used herein to refer to a decoder that can decode data that was encoded by a dynamic encoder.

Embodiments of multi-stage coding need not be limited to any particular type of input symbol. Typically, the values for the input symbols are selected from an alphabet of $2^M$ symbols for some positive integer M. In such cases, an input symbol can be represented by a sequence of M bits of data from the input file. The value of M is often determined based on, for example, the uses of the application, the communication channel, and/or the size of the output symbols. Additionally, the size of an output symbol is often determined based on the application, the channel, and/or the size of the input symbols. In some cases, the coding process might be simplified if the output symbol values and the input symbol values were the same size (i.e., representable by the same number of bits or selected from the same alphabet). If that is the case, then the input symbol value size is limited when the output symbol value size is limited. For example, it may be desired to put output symbols in packets of limited size. If some data about a key associated with the output symbols were to be transmitted in order to recover the key at the receiver, the output symbol would preferably be small enough to accommodate, in one packet, the output symbol value and the data about the key.

As an example, if an input file is a multiple megabyte file, the input file might be broken into thousands, tens of thousands, or hundreds of thousands of input symbols with each input symbol encoding thousands, hundreds, or only few bytes. As another example, for a packet-based Internet channel, a packet with a payload of size of 1024 bytes might be appropriate (a byte is 8 bits). In this example, assuming each packet contains one output symbol and 8 bytes of auxiliary information, an output symbol size of 8128 bits ((1024−8)*8) would be appropriate. Thus, the input symbol size could be chosen as M=(1024−8)*8, or 8128 bits. As another example, some satellite systems use the MPEG packet standard, where the payload of each packet comprises 188 bytes. In that example, assuming each packet contains one output symbol and 4 bytes of auxiliary information, an output symbol size of 1472 bits ((188−4)*8), would be appropriate. Thus, the input symbol size could be chosen as M=(188−4)*8, or 1472 bits. In a general-purpose communication system using multi-stage coding, the application-specific parameters, such as the input symbol size (i.e., M, the number of bits encoded by an input symbol), might be variables set by the application.

Each output symbol has a value. In one preferred embodiment, which we consider below, each output symbol also has associated therewith an identifier called its "key." Preferably, the key of each output symbol can be easily determined by the recipient to allow the recipient to distinguish one output symbol from other output symbols. Preferably, the key of an output symbol is distinct from the keys of all other output symbols. There are various forms of keying discussed in previous art. For example, Luby I describes various forms of keying that can be employed in embodiments of the present invention.

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of chain reaction coding taught in Luby I. In particular, multi-stage output symbols are information additive, so any suitable number of packets can be used to recover an input file to a desired degree of accuracy. These conditions do not adversely affect the communication process when multi-stage coding is used, because the output symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With multi-stage coding, a receiver is not constrained to pickup any particular set of packets, so it can receive some packets from one transmitter, switch to another transmitter, lose some packets, miss the beginning or end of a given transmission and still recover an input file. The ability to join and leave a transmission without receiver-transmitter coordination helps to simplify the communication process.

In some embodiments, transmitting a file using multi-stage coding can include generating, forming or extracting input symbols from an input file, computing redundant symbols, encoding input and redundant symbols into one or more output symbols, where each output symbol is generated based on its key independently of all other output symbols, and transmitting the output symbols to one or more recipients over a channel. Additionally, in some embodiments, receiving (and reconstructing) a copy of the input file using multi-stage coding can include receiving some set or subset of output symbols from one of more data streams, and decoding the input symbols from the values and keys of the received output symbols.

Systematic Codes and Nonsystematic Codes

A systematic code is a code where the source symbols are among the encoded symbols that can be transmitted. In this case, the encoded symbols are comprised of source symbols and redundant symbols, also called repair symbols, generated from the source symbols. A systematic code is preferable over a non-systematic code for many applications, for a variety of reasons. For example, in a file delivery application, it is useful to be able to start transmitting data in sequential order while the data is being used to generate repair data, where the process of generating repair data can take some amount of time. As another example, many applications prefer to send the original source data in sequential order in its unmodified form to one channel, and to send repair data to another channel. One typical reason for this is to support both legacy receivers that don't incorporate FEC decoding while at the same time providing a better experience to enhanced receivers that do incorporate FEC decoding, wherein legacy receivers join only the source data channel and enhanced receivers join both the source data channel and the repair data channel.

In these and related types of applications it can sometimes be the case that the loss patterns and the fraction of loss among received source symbols by a receiver is quite different than that experienced among received repair symbols. For example, when source symbols are sent prior repair symbols, due to the bursty loss conditions of the channel, the fraction and pattern of loss among source symbols can be quite different than the corresponding fraction and pattern of loss among repair symbols, and the pattern of loss among source symbols may be far from what might be typical than if the loss were uniformly random. As another example, when the source data is sent on one channel and the repair data on another channel, there might be quite different loss conditions on the two channels. Thus, it is desirable to have a systematic FEC code that works well under different types of loss conditions.

Although examples herein refer to systematic codes (where the output or encoded symbols include the source or input symbols) or nonsystematic codes, the teachings herein should be assumed to be applicable to both, unless otherwise indicated. Shokrollahi III teaches methods to convert a non-systematic chain reaction code to a systematic code in such a way that the robustness properties of the non-systematic code are maintained by the systematic code so constructed.

In particular, using the methods taught in Shokrollahi III, the constructed systematic code has the property that there is little differentiation in terms of recoverability by the decoder between lost source symbols and lost repair symbols, i.e., the decoding recovery probability is essentially the same for a given amount of total loss almost independent of the proportion of the loss among the source symbols compared to the proportion of the loss among the repair symbols. Furthermore, the pattern of loss among the encoded symbols does not significantly affect the decoding recovery probability. In comparison, for the constructions of other systematic codes, such as those described for Tornado codes or for IETF LDPC codes, there is in many cases a strong differentiation in terms of recoverability by the decoder between lost source symbols and lost repair symbols, i.e., the decoding recovery probability can vary widely for the same for a given amount of total loss depending on the proportion of the loss among the source symbols compared to the proportion of the loss among the repair symbols. Furthermore, the pattern of loss amongst the encoded symbols can have a strong effect on the decoding recovery probability. The Tornado codes and IETF LDPC codes have reasonably good recovery properties if the losses of encoded symbols are uniformly random among all of the encoded symbols, but the recovery properties deteriorate as the loss model deviates from uniform random loss. Thus, in this sense, the embodiments taught in Shokrollahi III have advantages over other constructions of systematic codes.

For an FEC code with the property that there is a strong effect in terms of recoverability by the decoder depending on the proportion of lost source symbols and lost repair symbols, and depending on loss patterns, one approach to overcome this property when it is applicable is to send the encoded symbols in a uniformly random order, i.e., the combination of source and repair symbols are sent in uniformly random order, and thus the source symbols are randomly interspersed among the repair symbols. Sending the encoded symbols in random order has an advantage that whatever the channel loss model, whether the losses are bursty or uniformly random or some other type of losses, the losses to the encoded symbols are still random. However, as noted above, this approach is not desirable for some applications, e.g., for applications where it is desirable to send the source symbols in sequence before the repair symbols, or where the source symbols are sent on a different channel than the repair symbols.

In such cases, constructions of systematic codes where the pattern of loss among the encoded symbols does not greatly affect the recovery properties of the decoder are desired and some examples are provided herein.

In one approach to such a systematic FEC encoder, source symbols are obtained by an encoder that includes multiple encoder subblocks or subprocesses, one of which operates as a decoder to generate intermediate symbols that are input symbols for another subblock or subprocess. The intermediate symbols are then applied to another subblock or subprocess that encodes the intermediate symbols into the output symbols so that the output symbols include the source symbols (along with additional, redundant symbols) generated from one consistent process, thereby providing robustness benefits and other benefits over an encoder that is a systematic encoder that uses one process (e.g., copying) to get the source symbols for the output symbol set and another process to get the redundant symbols for the output symbol set.

The output encoding can be a chain reaction encoder, a static encoder or other variations. Appendix A describes a systematic code embodiment. After reading the present disclosure, one of ordinary skill in the art should be able to easily extend the teachings of Shokrollahi III to apply to systematic codes such as the Tornado codes and IETF LDPC codes, to yield new versions of these codes that are also systematic codes but have better recovery properties. In particular, the new versions of these codes, obtained by applying the general method described below, are enhanced to have the property that the proportion of loss among the source symbols compared to the proportion of loss among the repair symbols does not significantly affect the decoding recovery probability, and furthermore that the pattern of loss does not significantly affect the decoding recovery probability. Thus, these codes can be effectively used in the applications described above that require usage of systematic FEC codes with recovery properties that are not strongly affected by different fractional loss amounts amongst source and repair symbols or by different loss patterns.

The new encoding method can be applied generally to encoding for systematic FEC codes, non-systematic FEC codes, fixed rate FEC codes and chain reaction FEC codes to yield an overall encoding method for new enhanced systematic FEC codes. There is also a corresponding new decoding method that can be applied.

Decoder-in-the-Encoder Example

An example will now be provided. Let encoding method A be an encoding method for a fixed-rate (non-systematic or systematic) FEC code A that generates N encoded symbols from K source symbols, where N>K and N is at least large enough so that N encoded symbols can be decoded into the original source symbols using decoding method A, where decoding method A is the inverse of encoding method A.

Suppose that associated with each encoded symbol is an ESI (Encoded Symbol Identifier) that identifies that encoded symbol. The ESI might just be a unique number. In one embodiment of a new encoding method B, K and N are input parameters. This new encoding method B generates N encoded symbols from K source symbols $C'(1), \ldots, C'(K)$ using encoding method A and decoding method A for FEC code A, performed by hardware and/or software as follows:

(1) using encoding method A, generate the ESIs associated with the N encoded symbols that would be generated from K source symbols, (2) randomly (or pseudorandomly, etc.) select K out of the N ESIs generated in step (1) to arrive at the ESI set $ESI(1), \ldots, ESI(K)$, which can be listed in the random order in which they were selected, (3) for each $i=1, \ldots, K$, associate source symbol $C'(i)$ with $ESI(i)$, (4) apply the decoding method A to the encoded symbols $C'(1), \ldots, C'(K)$ with corresponding ESIs $ESI(1), \ldots, ESI(K)$ to generate the decoded symbols $C(1), \ldots, C(K)$, and (5) apply the encoding method A to the decoded symbols C(1), . . . , C(K) to generated encoded symbols E(1), . . . , E(N) with associated ESIs.

Note that the output of encoding method B is N encoded symbols, among which are the source symbols C'(1), . . . , C'(K) with associated ESIs ESI(1), . . . , ESI(K). Thus, encoding method B produces a systematic encoding of the source data.

One embodiment of a new decoding method B that corresponds to the new encoding method B just described is the following, where K and N are input parameters to this method that are used throughout. This new decoding method B recovers K source symbols C'(1), . . . , C'(K) from K received encoded symbols E(1), . . . , E(K) with associated ESIs ESI'(1), . . . , ESI'(K). The received symbols need not be exactly the sent symbols. The method, performed by hardware and/or software, is as follows:

(1) apply decoding method A to the encoded symbols E(1), . . . , E(K) with associated ESIs ESI'(1), . . . , ESI'(K) to generate decoded symbols C(1), . . . , C(K), (2) using encoding method A, generate the ESIs associated with the N encoded symbols that would be generated from K source symbols, (3) randomly (or pseudorandomly, etc.) select K out of the N ESIs generated in step (2), and suppose the K ESIs selected are ESI(1), . . . , ESI(K), listed in the random order in which they were selected, and (4) apply the encoding method A to generate the source symbols C'(1), . . . , C'(K) associated with the ESIs ESI(1), . . . , ESI(K), respectively.

Methods and apparatus that operate as just described have some desirable properties. For example, consider an FEC code A that is a systematic code and has the property that a random set of K received encoded symbols can be decoded with high probability, but also has the property that when K encoded symbols are received and the proportion of source symbols among the received encoded symbols is not close to K/N then it cannot be decoded with high probability. In this case, the embodiment describes a new FEC code B which uses the encoding and decoding methods of FEC code A, and the new FEC code B has the desirable property that it will decode with high probability from a set of K received encoded symbols, independent of the proportion of source symbols among the received encoded symbols.

There are many variants of the above embodiment. For example, in step (2) of the new encoding method B, the random selection of the ESIs could be pseudo-random, or based on some other method that produces a good selection of the ESIs. In the case that FEC code A is a systematic code, it is preferable that the fraction of ESIs that are selected in step (2) from among the systematic ESIs is proportional to the rate of FEC code A, i.e., proportional to K/N. It is preferable that the random choices of the ESIs made by new encoding method B in step (2) can be represented by a succinct amount of data, for example by a seed to a well-known or agreed upon pseudo-random generator together with a agreed upon method to choose the ESIs based on the seed and how the pseudo-random generator works, so that the new decoding method B can make exactly the same choices of K ESIs in step (3) based on the same seed and pseudo-random generator and methods for generating ESIs. In general, it is preferable if the process used in new encoding method B in step (2) to generate the sequence of ESIs and the process used in new decoding method B in step (2) to generate the sequence of ESIs both generate the same sequence of ESIs, to ensure that new decoding method B is the inverse of new encoding method B.

There are other variants as well, where for example explicit ESIs are not used, but instead the unique identifier of an encoded symbol is by its position with respect to other encoded symbols, or by other means.

In another variant, the original ESIs of the FEC code A are remapped by the FEC code B so that the ordered set of source symbols are assigned the ESIs 1, . . . , K in consecutive order, and the repair symbols are assigned the ESIs K+1, . . . , N. In this variant, the remapping of ESIs can occur at a sender just after encoding method B has generated the encoded symbols but before the encoded symbols are transmitted, and the inverse remapping of ESIs can occur at a receiver as the encoded symbols are received but before the encoded symbols are processed for recovery of the original source symbols by decoding method B.

As another variant, in step (2) of new encoding method B there might be an initial selection of K+A ESIs instead of K, where A is a value that is chosen to ensure decodability with high probability, and then during a simulation of the decoding process it is determined which of the K out of K+A ESIs are actually used during decoding, and the initial set of K+A ESIs is pared down to selecting these K ESIs in step (2) and used in steps (3) and (4). Similar variants apply to new decoding method B.

As another variant, not all of the ESIs need be generated in step (1) of new encoding method B and step (2) of new decoding method B, and in fact in many typical cases the ESIs of the N encoded symbols are simply the consecutive integers 0, . . . , N−1. In other variants, not all of the encoded symbols in step (4) of new decoding method B need be recomputed, as some of the received encoded symbols may correspond to some of the source symbols that are being recovered. Similarly, in step (5) of new encoding method B, some of the encoded symbol values may not need to be computed if they correspond to source symbols that are part of the encoded symbols.

The methods and embodiments described above have many applications. For example, encoding method B and decoding method B and their variants can be applied to Tornado codes and to IETF LDPC codes to provide improved reception overhead and decoding failure probability performance. In general, these new methods apply to any fixed rate FEC code. Variants of these new methods can also be applied to FEC codes that have no fixed rate.

Inactivation

Inactivation decoding, as taught in Shokrollahi II, is a general method that can be applied in combination with belief propagation whenever solving for a set of unknown variables from a set of known linear equation values, and is particularly beneficial when implementing efficient encoding and decoding methods that are based on sets of linear equations. In order to distinguish between inactivation decoding as described in Shokrollahi II and permanent inactivation decoding as described hereinbelow, "on the fly" inactivation (abbreviated to "OTF inactivation" in places) is used to refer to the methods and teachings of Shokrollahi II, whereas "permanent inactivation" is used to refer to the methods and teachings herein where inactivations are selected in advance.

One tenet of belief propagation decoding is that, whenever possible during the decoding process, the decoder should use a (possibly reduced) equation that depends on one remaining unknown variable to solve for that variable, and that equation is thus associated with that variable, and then reduce remaining unused equations by eliminating the dependence of those equations on the solved variable. Such a simple belief-propagation based decoding process has been used, for example, in some of the embodiments of Tornado codes, the chain reaction codes as described in Luby I, Luby II, Shokrollahi I, Shokrollahi II, Luby III, Shokrollahi IV, and the IETF LDPC codes.

OTF inactivation decoding goes in multiple phases. In a first phase of an OTF inactivation decoding method, whenever the belief propagation decoding process cannot continue because there is no remaining equation that depends on just one remaining unknown variable, the decoder will "OTF inactivate" one or more unknown variables and consider them "solved" with respect to the belief propagation process and "eliminated" from the remaining equations (even though they really are not), thus possibly allowing the belief propagation decoding process to continue. The variables that are OTF inactivated during the first phase are then solved for, for example using Gaussian elimination or more computationally efficient methods, in for example a second phase, and then in a third phase, the values of these OTF inactivated variables are used to fully solve for the variable associated with the equations during the first phase of decoding.

OTF inactivation decoding, as taught in greater detail in Shokrollahi II, can be applied to many other types of codes beyond chain reaction codes. For example, it can be applied to the general class of LDPC and LDGM codes, in particular to the IETF LDPC codes and to the Tornado codes, resulting in improvements in reliability (decreasing the probability of failing to decode) and/or CPU and/or memory performance (increasing the speed of encoding and/or decoding and/or decreasing the memory size required and/or access pattern requirements) for those types of codes.

Some of the variants of chain reaction code embodiments in combination with OTF inactivation decoding will now be described. One skilled in the art will recognize, after reading this disclosure, that these variants also apply to other code embodiments, such as Tornado codes and IETF LDPC codes. One variant is to use symbols comprising of GF(256) elements (the Galois field with 256 finite field elements) as High Density Parity Check (HDPC) symbols, as taught in Shokrollahi IV. This generation of HDPC symbols has the effect of giving the decoding matrix higher robustness in terms of its rank properties.

Another variant is to alter the output distribution of the codes such that when the number of input symbols is larger than some threshold, say 2000 or 4000 or 8000 symbols, a different distribution takes effect, which may lead to better OTF inactivation behavior for larger block lengths. Such a variant is taught in Shokrollahi IV.

As explained above, chain reaction encoding may involve a static encoding and a dynamic encoding. The static encoding, in a specific embodiment, is done in two steps, 1) an LDPC coding, and 2) an HDPC coding. More precisely, assume that the source is a vector $x=(x_1, \ldots, x_k)$ where each $x_i$ is a symbol. A symbol can be a value stored in a contiguous piece of memory comprising a number of bits; its size can vary, but what matters is that symbols can be XORed (i.e., combined by an exclusive "OR" operation; an operation denoted by $\oplus$ herein). Unless otherwise indicated, XOR for multi-bit operands refers to bitwise XOR. Other operations besides XOR might be used in other implementations.

The LDPC coding appends some number, l, of LDPC redundant symbols $y=(y_1, \ldots, y_l)$ to the vector x. The HDPC coding appends some number, h, of symbols $z=(z_1, \ldots, z_h)$ to the vector (x|y). The combined vector (x|y|z) is called the vector of input symbols to the dynamic encoder. The creation of these vectors can be described in the matrix notation shown in Equation 1.

$$\begin{pmatrix} y_1 \\ \vdots \\ y_l \end{pmatrix} = C \cdot \begin{pmatrix} x_1 \\ \vdots \\ x_l \end{pmatrix}, \text{ and } \begin{pmatrix} z_1 \\ \vdots \\ z_h \end{pmatrix} = H \cdot \begin{pmatrix} x_1 \\ \vdots \\ x_k \\ y_1 \\ \vdots \\ y_l \end{pmatrix}. \quad \text{(Equ. 1)}$$

The matrix C describes how the LDPC symbols y are generated from the vector x, and the matrix H describes how the HDPC symbols z are generated from the vector (x|y). For example, Shokrollahi IV teaches a method in which the generation is as shown in Equation 2.

$$\begin{pmatrix} y_1 \\ \vdots \\ y_l \end{pmatrix} = (C_1 \mid C_2 \ldots \mid C_{m-1} \mid C_m) \cdot \begin{pmatrix} x_1 \\ x_2 \\ \vdots \\ x_k \end{pmatrix} \quad \text{(Equ. 2)}$$

In Equation 2, $C_i$ is the circulant matrix in which each column and each row is of weight 3, and the first column has a 1 only at positions 1, i+1, and 2i+1. The matrix $C_m$ comprises the first r columns of the matrix $C_m$, where r is calculated as k=(m−1)l+r, 0≦r l. Thus, m and r are uniquely determined by l and k. The value of l is determined from k according to the formula in Equation 3, where next prime (a) is the smallest prime number p≧a.

$$l = nextprime\left(\text{ceil}\left(\frac{1 + \sqrt{1 + 8k}}{2}\right) + \text{ceil}(0.01k)\right), \quad \text{(Equ. 3)}$$

In Equation 3, ceil(x) is the smallest integer that is greater than or equal to x. According to Shokrollahi IV, the computation of the HDPC symbols can be described using the matrix H described by Equation 4, where v is a (dense) vector of length h over GF(256), $\alpha_1, \ldots, \alpha_{k+i}, \beta_2, \ldots, \beta_{k+l}$ are elements of GF(256), and $\Pi_i \alpha_i \neq 0$.

$$H = (\Delta_{2,1} \mid L \mid \Delta_{2,k+l-1} \mid v) \cdot \begin{pmatrix} \alpha_1 & 0 & \ldots & 0 & 0 \\ \beta_2 & \alpha_2 & \ldots & 0 & 0 \\ \vdots & \vdots & o & \vdots & \vdots \\ 0 & 0 & \ldots & \alpha_{k+l-1} & 0 \\ 0 & 0 & \ldots & \beta_{k+1} & \alpha_{k+l} \end{pmatrix}, \quad \text{(Equ. 4)}$$

The vectors $\Delta_{2,j}$ are binary vectors of weight 2 and length h. In a specific implementation, they are obtained as the vector of differences of two consecutive bit vectors enumerated in the binary reflected Gray code. A specific implementation might also use specific values for the $\alpha_i$ and the $\beta_j$, as well as a specific value for v.

System Overview

FIG. 1 is a block diagram of a communications system 100 that uses multi-stage coding. It is similar to that shown in Shokrollahi I, but in this case the encoder 115 takes into account a designation of which input symbols are "permanently inactivated" and does not include those in the dynamic encoding process. Likewise, the decoder 155 also takes these into account.

In some implementations, there is a high probability that the matrix representing the received symbols is of sufficient rank that the chain reaction process can proceed without the permanently inactivated symbols, but since those are available to the decoder because they were received (just not used in the dynamic encoding process), they might be used for recovering other symbols.

As illustrated in FIG. 1, K source symbols $(x_1, \ldots, x_k)$ are input to encoder 115 and, if decoding is successful with the symbols that become available to decoder 155, then decoder 115 can output a copy of those K source symbols. In some embodiments, a stream is parsed into K-symbol blocks and in some embodiments, a file of some number of source symbols larger than K is divided into K-sized symbol blocks and so transmitted. In some embodiments, where a block size of K'>K is preferred, K'−K padding symbols can be added to the K source symbols. It should be understood that encoder 115 might comprise multiple encoders, modules or the like, and that may also be the case for decoder 155.

As illustrated, encoder 115 also receives a sequence of dynamic keys from a dynamic key generator 120 and a sequence of static keys from as static key generator 130, each of which might be driven by a random number generator 135. The output of dynamic key generator 120 might be simply a cardinal number sequence, but that need not be the case. The operation of the key generators might be as shown in Shokrollahi I.

It should be understood that various functional blocks shown in the figures can be implemented as hardware with the specified inputs provided as input signals, or they can be implemented by a processor executing instructions that are stored in an instruction memory and executed in the appropriate order to perform the corresponding function. In some cases, specialized hardware is used to perform the functions and/or execute program code. Program code and processor are not always shown, but one of ordinary skill would know how to implement such details upon reading this disclosure.

Encoder 115 also receives inputs from an inactivation designator 125 and other parameters input to system 100 along the lines described elsewhere herein. Outputs of inactivation designator 125 might include a value, t, representing the number of input symbols that are designated as "permanently inactivated" for decoding purposes (the "PI list" indicates which t of the input symbols are on the list). As explained elsewhere, the input symbols used for encoding processes are just the K source symbols in some embodiments, but in other embodiments, there is some type of processing, conversion, encoding, decoding, etc. that generates the input symbols from the K source symbols beyond just copying them.

Input parameters might include random seeds used by the key generators and/or the encoder's encoding processes (described in more detail below), the number of encoding symbols to generate, the number of LDPC symbols to generate, the number of HDPC symbols to generate, the number of intermediate symbols to generate, the number of redundant symbols to generate, etc. and/or some of these values are calculated from other values available to encoder 115. For example, the number of LDPC symbols to be generated might be calculated entirely from a fixed formula and the value of K.

Encoder 115 generates, from its inputs, a sequence of encoded symbols $(B(I_0), B(I_1), B(I_2), \ldots)$ and provides them to a transmit module 140 that also receives the dynamic key values $(I_0, I_1, I_2, \ldots)$ from dynamic key generator 120, but this might not be necessary if there is another method of conveying that information. Transmit module 140 conveys what it is given to a channel 145, possibly in a conventional manner that does not need to be described here in more detail. A receive module 150 receives the encoded symbols and the dynamic key values (where needed). Channel 145 may be a channel through space (for transmitting from one place to be received at another place) or a channel through time (for recording to media, for example, for replay back at a later time). Channel 145 may cause the loss of some of the encoded symbols. Thus, the encoded symbols $B(I_a), B(I_b), \ldots$ that decoder 115 receives from receive module 150 might not equal the encoded symbols that transmit modules sent. This is indicated by the different subscripted indices.

Decoder 155 is preferably able to regenerate the keys used for the received symbols (which keys might differ), using dynamic key regenerator 160, random number generator 163 and static key generator 165, and to receive as inputs various decoding parameters. Some of these inputs might be hard-coded (i.e., input during construction of a device) and some might be changeable inputs.

Figure 2:
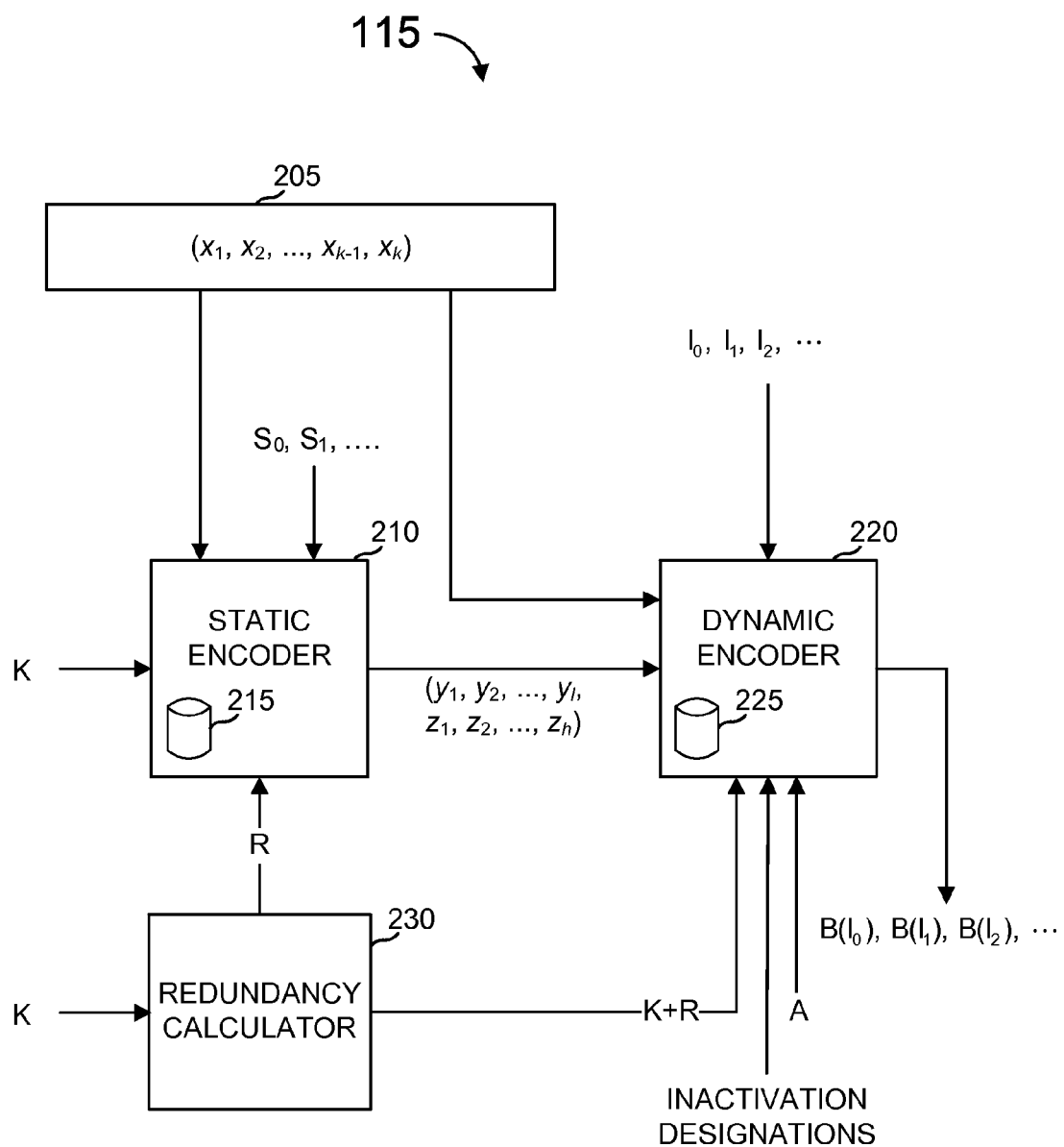
FIG. 2 is a block diagram of an encoder according to one embodiment of the present invention.

FIG. 2 is a block diagram of one specific embodiment of encoder 115 shown in FIG. 1. As illustrated there, the source symbols are stored in an input buffer 205 and provided to a static encoder 210 and a dynamic encoder 220, which also receive key inputs and other inputs. Static encoder 210 might include internal storage 215 (memory, buffer, virtual memory, register storage, etc.) for storing internal values and program instructions. Likewise, dynamic encoder 220 might include internal storage 225 (memory, buffer, virtual memory, register storage, etc.) for storing internal values and program instructions.

In some embodiments, a redundancy calculator 230 determines the number of redundant static encoder symbols to create. In the example shown, static encoder 210 generates l LDPC redundant symbols $(y_1, \ldots, y_l)$ from the source symbols (or in some cases, from input symbols derived from the source symbols) and h HDPC redundant symbols $(z_1, \ldots, z_h)$. In the embodiment shown, dynamic encoder 220 encodes the K source/input symbols, the l LDPC symbols, and the h HDPC symbols, using one code for combining nonpermanently inactivated symbols and another code (it might be the same, but is often different) for the permanently inactivated symbols. The latter might be a pass-through code. Further details are provided later in this disclosure.

Figure 3:
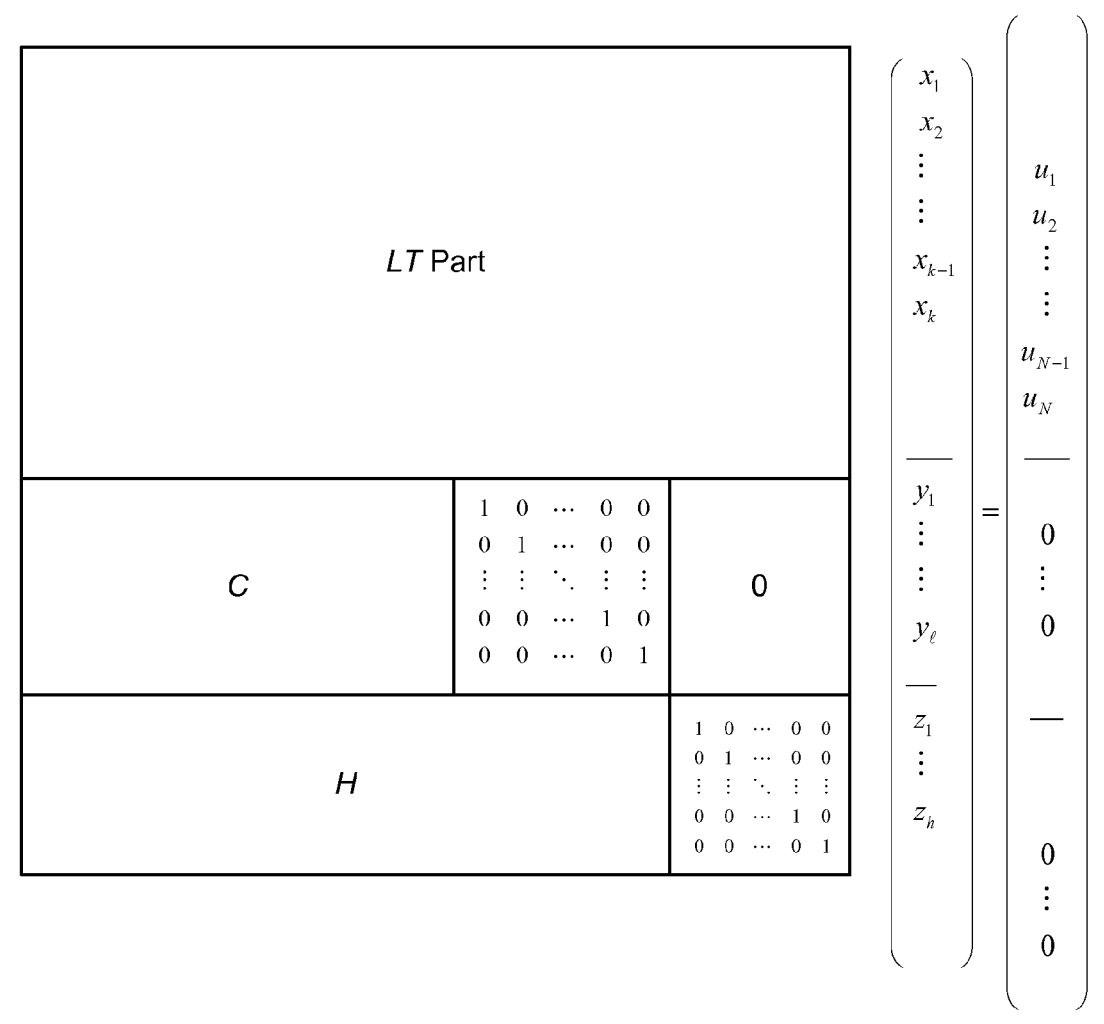

FIG. 3 illustrates a matrix representation of a problem to be solved by the decoder. At a decoder, N output symbols are available, denoted here by $u_1, \ldots, u_N$, (perhaps because that was what was received by a receiver), and the decoder will attempt to decode the input vector $x=(x_1, \ldots, x_k)$ from those output symbols. In doing so, the decoder performs operations corresponding to solving a system of linear equations of the type shown in FIG. 3.

The matrix show in FIG. 3 comprises k+l+h columns and N+l+h rows, with an LT part mapping the known relationship between each of the N received output symbols (the relationship is known because the decoder knows, for a given ESI, which input symbols are the neighbors of the output symbol with that ESI). The other elements are the C submatrix that represents the LDPC relationships, an l-by-l identity matrix to the right of C, an l-by-l zero matrix to the right of that (because the LDPC symbols did not take into account the HDPC symbols, in these embodiments), an H submatrix that represents the HDPC relationships between the input symbols, the LDPC symbols and the HDPC symbols, and an h-by-h identity matrix to the right of H.

In FIG. 3, the rows in the LT-part of the matrix correspond to the output symbols generated by the dynamic encoder that had been received, the C portion of the matrix describes the LDPC operations, and the H portion of the matrix describes the HDPC operations. As mentioned above, the task of the decoder is to solve this system of linear equations. This is done by a row/column permutation of the above matrix using the OTF inactivation methods taught in Shokrollahi II to transform it into one of the form shown in FIG. 9, described below.

Figure 4:
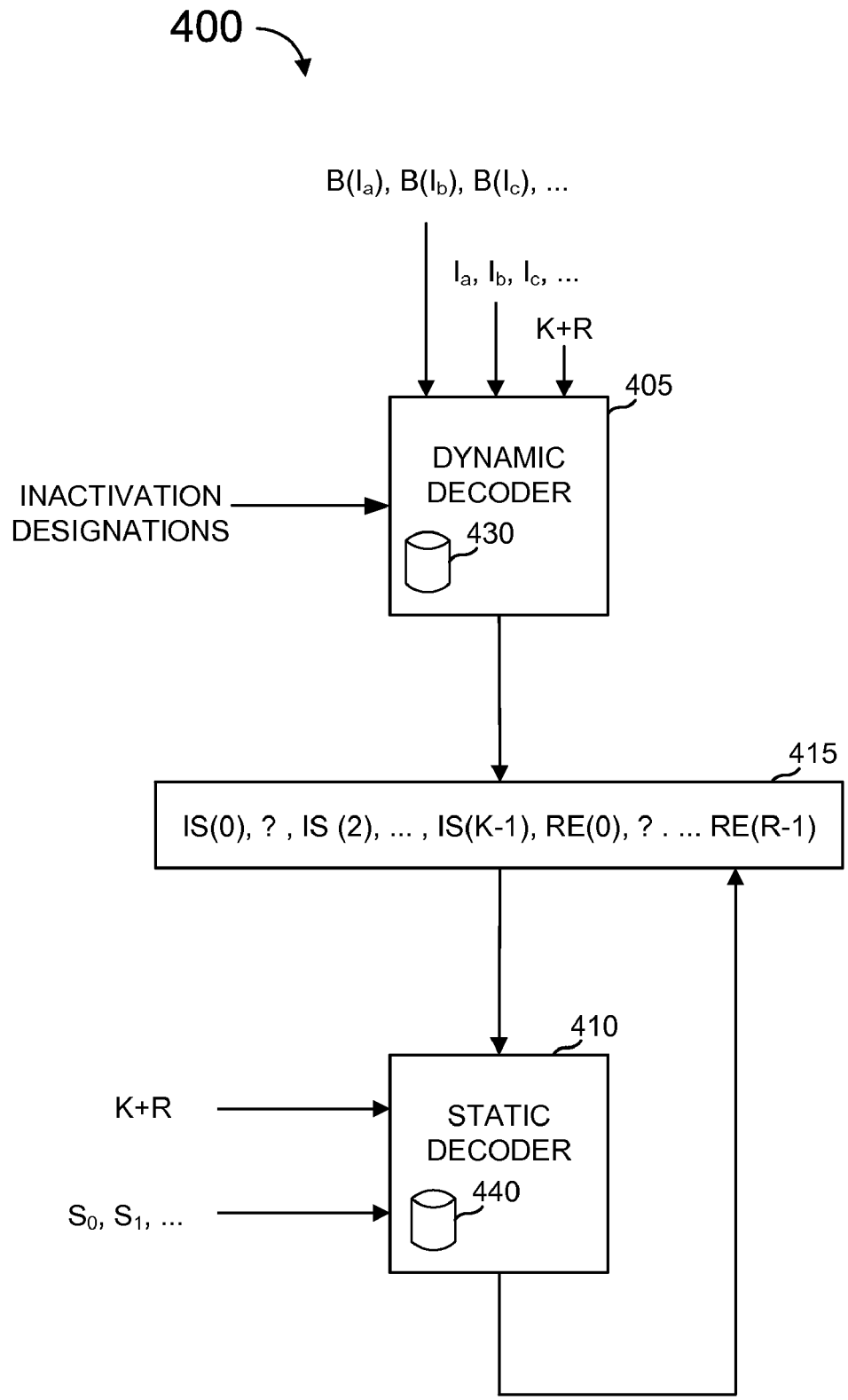
FIG. 4 is a simplified block diagram of a decoder according to one embodiment of the present invention.

FIG. 4 is a simplified block diagram illustrating one embodiment of decoder 400 according to the present invention. Decoder 400 can be used, for example, to implement decoder 155. Decoder 400 is similar to that shown in Shokrollahi I, but in this case it takes into account a designation of which input symbols are "permanently inactivated". As illustrated there, received symbols, their ESIs, K, R and possibly other parameters are provided to a dynamic decoder 405 that outputs to a buffer 415 some recovered symbols and redundant symbols. A static decoder 410 can use the contents of buffer 415 to recover additional symbols and replace unknown values with known values in buffer 415. Internal storage 430 and 440 are provided as needed for internal variable, fixed values and program code storage.

In certain applications, it may be more desirable to use a particular type of decoder. For example, if the number k of source symbols is not very large, e.g., less than 1000 or some other threshold, the variance involved in the probabilistic process of reception of encoded symbols may force decoder 155 to collect a number of encoded symbols that is significantly larger than k in order for the dynamic and the static decoder to correct the required number of erasures. In these cases, a different type of decoder can be used.

An embodiment of such a decoder that decodes the data using Gaussian elimination will now be described with reference to FIGS. 5, 6 and 7.

Figure 5:
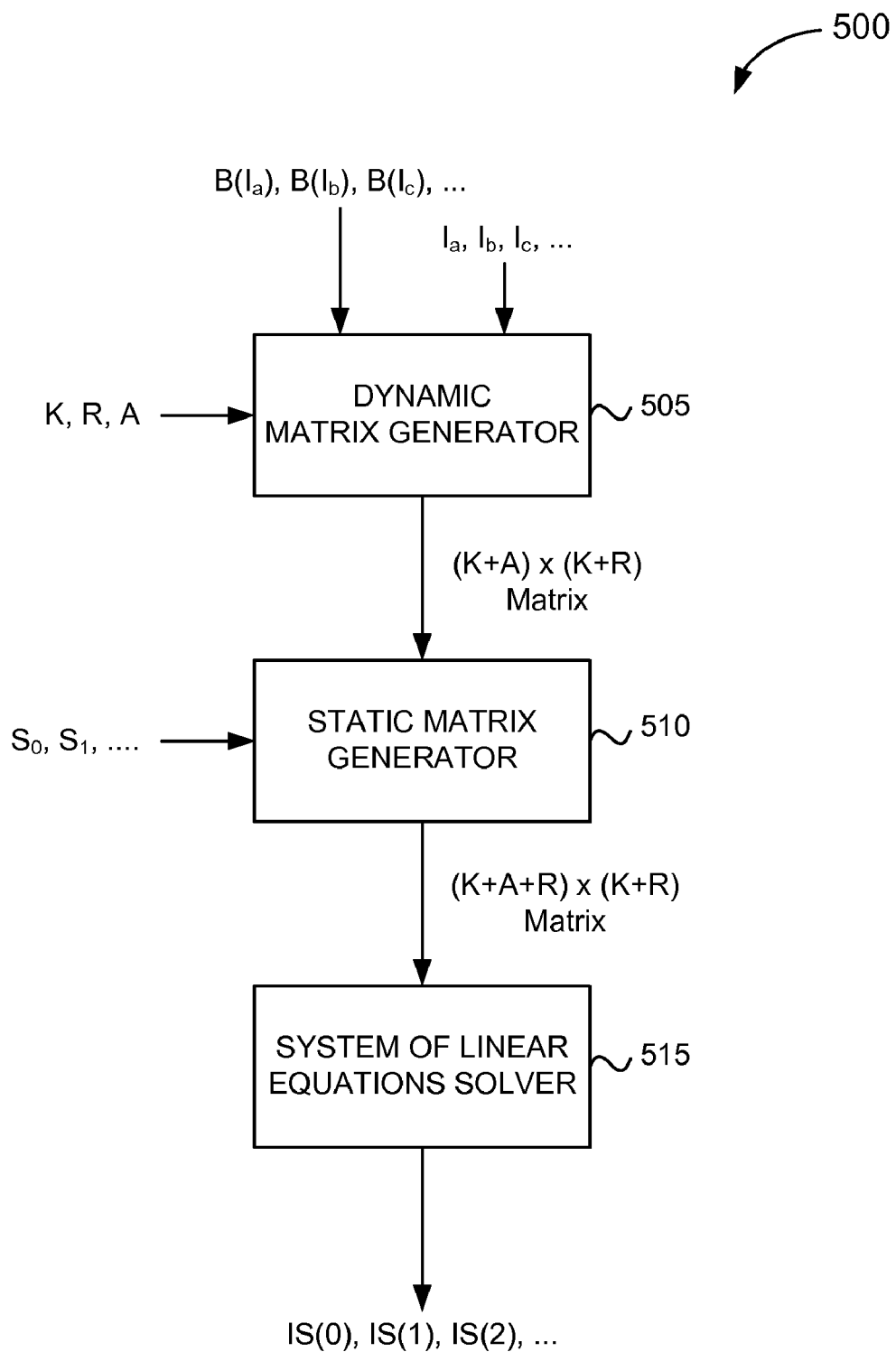
FIG. 5 is a simplified block diagram of elements of a decoder used to determine the equations that would solve for source symbols based on received encoded symbols.

Referring now to FIG. 5, decoder 500 comprises a dynamic matrix generator 505 and a static matrix generator 510. Dynamic matrix generator 505 receives encoded symbols $B(I_a), B(I_b), \ldots$, dynamic keys $I_a, I_b, \ldots$, and the parameters k and r. Additionally, dynamic matrix generator 505 receives another parameter a that describes how many encoded symbols should be collected (i.e., the number of encoded symbols collected is k+a). The determination of parameter a typically depends on the method used for dynamic and static encoding and will be described in more detail below. In the following description, the k+a encoded symbols collected will be referred to as $B(0), B(1), \ldots, B(k+a-1)$. Upon reception of these parameters, a system of linear equations of the form below in Equation 5 is set up by dynamic matrix generator 505 in which C is a matrix of format (k+a)×(k+r). Generation of matrix C by dynamic matrix generator 505 will be described in further detail below.

$$C \cdot \begin{pmatrix} IS(0) \\ \vdots \\ IS(k-1) \\ RE(0) \\ \vdots \\ RE(r-1) \end{pmatrix} = \begin{pmatrix} B(0) \\ \vdots \\ B(k+a-1) \end{pmatrix} \quad \text{(Equ. 5)}$$

Then, static matrix generator 510 receives matrix C from dynamic matrix generator 505, and uses the keys $S_0, S_1, \ldots$ to augment matrix C by r more rows to obtain a system of equations below, wherein the last r entries of the right hand vector are zero, and wherein M is of format (k+a+r)×(k+r). Finally, system of linear equations solver 515 is employed to solve this system of equations M and to obtain some or all of the input symbols $x=(x_1, \ldots, x_k)$. In one specific embodiment, system of linear equations solver 515 employs a Gaussian elimination algorithm to solve the system of linear equations.

$$M \cdot \begin{pmatrix} IS(0) \\ \vdots \\ IS(k-1) \\ RE(0) \\ \vdots \\ RE(r-1) \end{pmatrix} = \begin{pmatrix} B(0) \\ \vdots \\ B(k+a-1) \\ 0 \\ \vdots \\ 0 \end{pmatrix} \quad \text{(Equ. 6)}$$

Dynamic matrix generator 505 and static matrix generator 510 will now be described in further detail. FIG. 6 is a simplified flow diagram illustrating one embodiment 600 of a method employed by dynamic matrix generator 505. In step 605, dynamic matrix generator 1205 initializes a matrix C of format (k+a)×(k+r) to all zeros. Next, in step 610, the keys $I_a, I_b, \ldots$ are used to generate the weights $W(0), \ldots, W(k+a-1)$, and the lists $AL(0), \ldots, AL(k+a-1)$, respectively. Each of the lists AL(i) comprises W(i) integers $(j(0), \ldots, j(W(i)-1))$ in the range $0, \ldots, k+r-1$. In step 615, these integers are used to set entries $C(i,j(0)), \ldots, C(i,j(W(i)-1))$ to 1. As explained above, matrix C gives rise to a system of equations for the unknowns $(IS(0), \ldots, IS(k-1), RE(0), \ldots, RE(r-1))$ in terms of the received symbols $(B(0), \ldots, B(k+a-1))$. The reason is the following: once dynamic encoder chooses weight W(i) and associate list $AL(i)=(j(0), \ldots, j(W(i)-1))$, the corresponding output symbol B(i) is obtained as shown below, wherein L(j) denotes the unknown value of reconstruction buffer 1925 at position j, i.e., L is the vector of input symbols to the dynamic encoder, i.e. L is the concatenation of the k source symbols IS and the r redundant symbols RE. These equations, accumulated for all values of i between 0 and k+a−1, give rise to the desired system of equations represented in Equation 7.

$$B(i)=L(j(0))\oplus L(j(1))\oplus \ldots \oplus L(j(W(i)-1)) \quad \text{(Equ. 7)}$$

Figure 7:
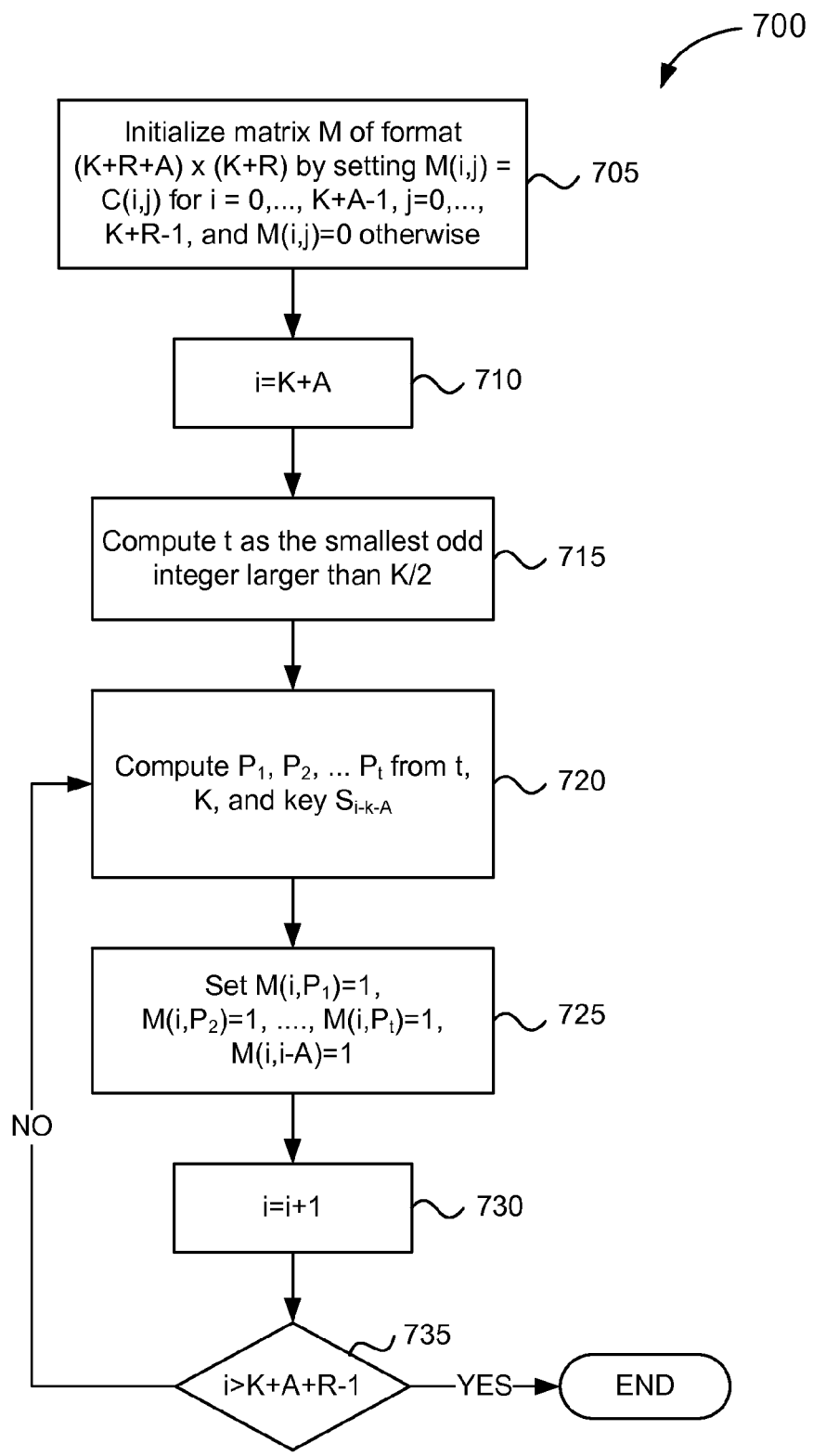
FIG. 7 is a simplified flow diagram illustrating one embodiment of a method employed by static matrix generator.

FIG. 7 is a simplified flow diagram illustrating one embodiment of a method 700 employed by static matrix generator 510. In step 705, matrix M of format (k+r+a)×(k+r) is initialized by letting the first k+a rows of M equal to the matrix C calculated by dynamic matrix generator 505. The remaining rows of M are initialized to zero. Next, in step 710, a variable i is initialized to k+a. This variable keeps track of the last r rows of M. In step 715, the number t of associates of the redundant symbol i−k−a is computed.

In step 720, an associator computes indices $P_1, \ldots, P_t$ between 0 and k−1 from static key $S_i$, number of input symbols K, and the integer t. Then, the corresponding positions of the matrix M are set to 1 in step 725. The increment in step 730 and the test in step 735 ensure that all the last r rows of M are visited and computed.

Figure 6:
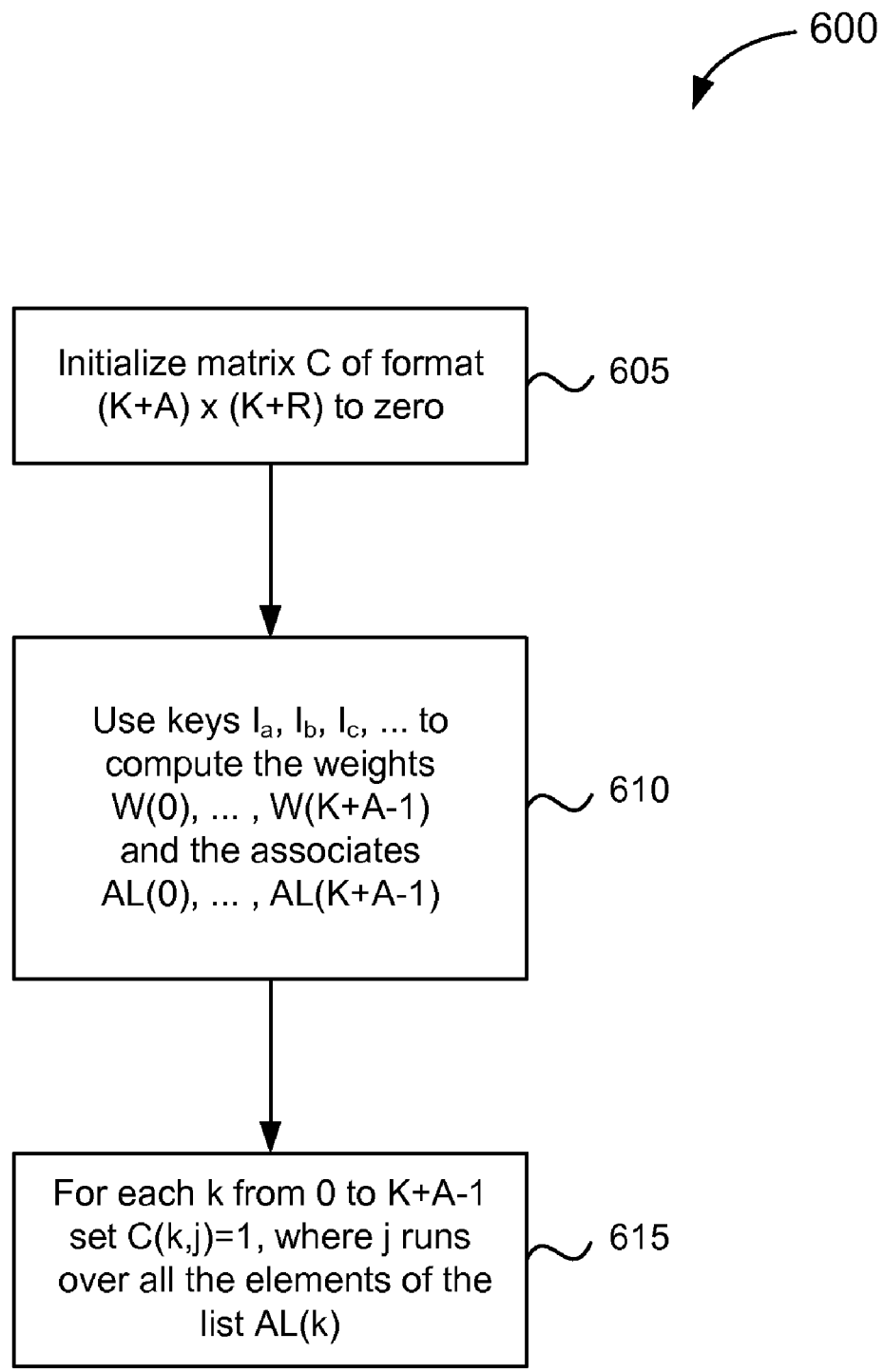
FIG. 6 is a simplified flow diagram illustrating one embodiment of a method employed by dynamic matrix generator.

In some instances, the embodiment shown in FIGS. 5, 6 and 7 may be somewhat more optimal because it allows for collecting relatively fewer output symbols for successful decoding than other embodiments. The choice of the decoder depends to a large extent on the application, and, for example, whether or not the number of collected output symbols is a critical resource.

Once the input symbols are prepared, the output symbols are computed using an appropriate chain reaction code. The description of this code is complete once an output degree distribution is given.

FIG. 8 shows an example output degree distribution, wherein an output degree of an output symbol is the number of input symbols (neighbors) it depends upon, i.e., its "weight" or "degree". The example degree distribution lookup table shown in FIG. 8 can be used by an encoder or decoder to determine the weight of an output symbol.

For each output symbol generated, there is a random number, r, that is associated with that output symbol. It can be the index, the representative label, etc. of the output symbol, or a distinct number, so long as encoders and decoders can be consistent. In this example, r is between 0 and $2^{20}$, but in other examples, other ranges are possible (such as 0 to $2^{32}$). The generation of r can be done in an explicit way using randomness generating tables, but the exact operation of how to generate these random numbers can vary. For any value of r, there is exactly one cell the M[d] column of the degree distribution lookup table wherein M[d−1]<r≦M[d] is true. For that one cell, there is a corresponding value in the d column, and the encoder/decoder uses that as the weight or degree for the output symbol. For example, where an output symbol has r=900,000, the degree for that output symbol would be seven.

Figure 9:
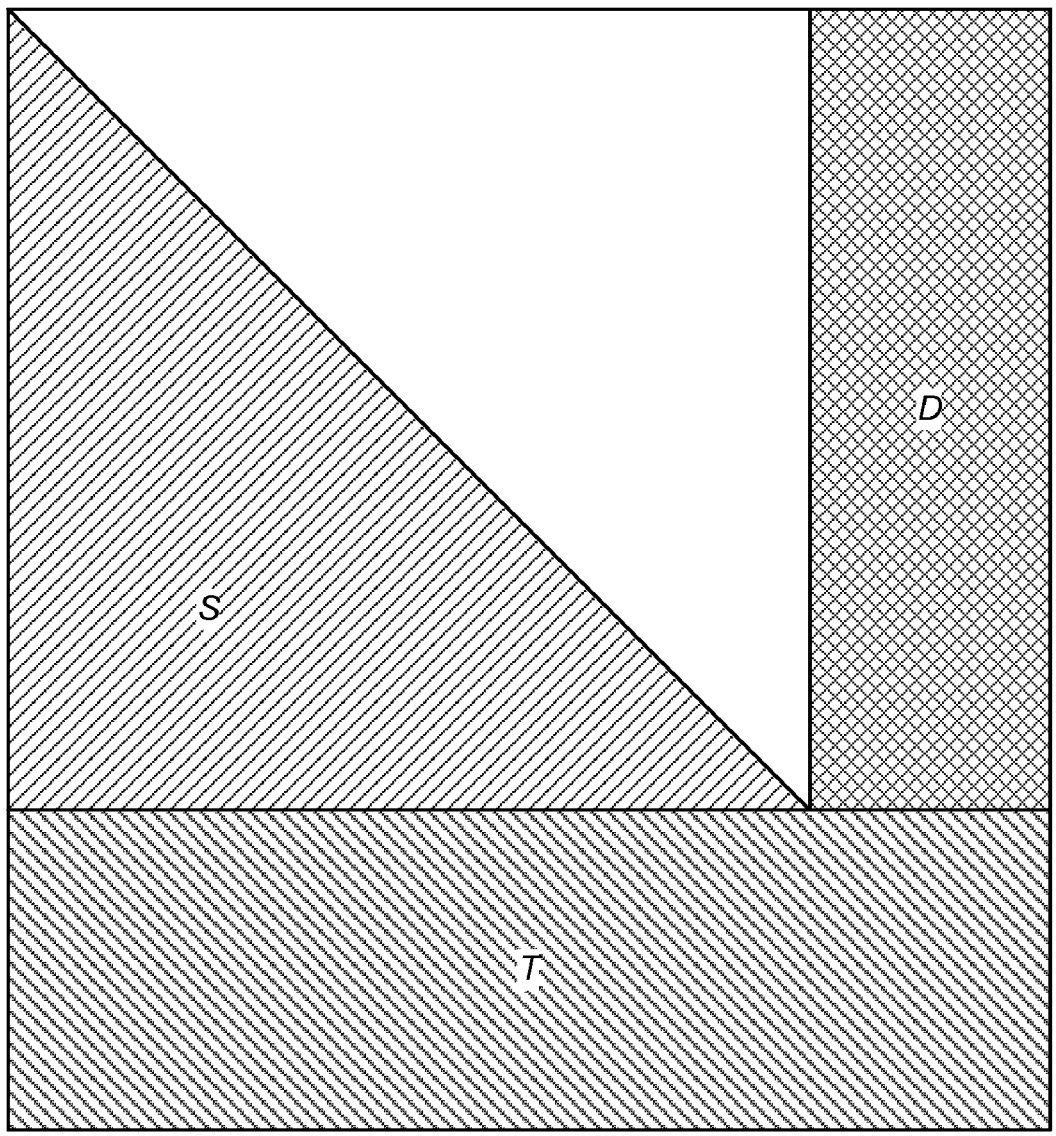
FIG. 9 illustrates the makeup of a decoding matrix following a set of chain reaction operations and on-the-fly (OTF) inactivation decoding.

In FIG. 9, S is a lower triangular sparse matrix, and D is a matrix obtained by a process called OTF inactivation decoding. Once the matrix is in this form, the rows of T that are below S are eliminated via S, and the remaining part of T is solved using a Gaussian elimination algorithm. The Gaussian elimination can be modified so as to separate computations in GF(2) from those in GF(256). This Gaussian elimination step reveals the values of the input symbols corresponding to the columns of D, which in typical embodiments correspond to the OTF inactivated symbols. A back-substitution then reveals the values of the variables corresponding to the columns of S, and hence the values of all the input symbols.

In FIG. 9, the columns of D are the OTF inactivated columns of the matrix shown in FIG. 8 after OTF inactivation decoding, and the number of columns of D is called its OTF inactivation width, denoted by w. The number of operations (in terms of XORs of symbols) to calculate the input symbols can be estimated as follows: The w OTF inactivated input symbols are calculated using roughly $w^2/2$ XORs. If $\alpha$ and $\beta$ denote the average weights of the matrices D and S, respectively, then another $(k+l+h-w)(\alpha+\beta)$ XORs can be used to calculate the non-OTF inactivated input symbols. This results in the rough estimate for the number of XORs illustrated in Equation 8.

$$\frac{w^2}{2} + (k+l+h-w)(\alpha+\beta) \qquad \text{(Equ. 8)}$$

It is important to note that this is only a very rough estimate, which does not take into account the complexity of operating in the field GF(256), which is an inevitable part of the decoding, especially at low overheads.

Although the description and analysis above is specific to particular embodiments of chain reaction codes, the methods and processes can also be applied to other codes for efficient decoding, for example IETF LDPC codes, Tornado codes, etc. In general, solving linear systems of equations, in particular solving for input symbols based on output symbols, particular sparse systems of equations that are amenable to being solved in large part using belief propagation, can in many cases be more efficiently and/or more reliably solved using the OTF inactivation decoding methods described above. For example, it is desirable that OTF inactivation decoding can be applied in a way so that $(\alpha+\beta)$ and w are small, in order to achieve a low CPU decoding complexity.

Permanent Inactivation

In the following description, equations can correspond to received encoded symbols and variables can correspond to the source symbols or a combined set of source and redundant symbols generated from the source symbols that are to be solved for based on received encoded symbols. In the specification provided as Appendix A, the encoded symbols might be referred to as "encoding symbols" (and there are other variations, such as the use herein of the variable "t" to refer to the number of permanently inactivated symbols while "P" is used in Appendix A), but it should be apparent after reading the entire specification and appendix how the references relate.

Permanent inactivation is used to determine at the decoder a set of variables to inactivate, called the permanently inactivated symbols or variables, before the first phase of the decoding process is initiated. The permanent inactivation decoding methods described below can be applied either to existing codes, or codes can be specially designed to work even better in conjunction with permanent inactivation decoding. Permanent inactivation decoding methods can be applied to solving any system of linear equations, and in particular can be applied to chain reaction codes, IETF LDPC codes and Tornado codes.

Permanent inactivation decoding is a general method that can be applied in combination with belief propagation decoding and/or OTF inactivation decoding whenever solving for a set of unknown variables from a set of known linear equation values, and is particularly beneficial when implementing efficient encoding and decoding methods that are based on sets of linear equations. In a first phase, based on the structure of the known encoding method or based on the received equations, a set of unknown variables are declared to be permanently inactivated, and the permanently inactivated variables are removed from the linear equations and considered to be "solved" in the second phase of the decoding process (except that as the second phase linear equations are reduced, the same reductions are performed on the permanently inactivated variables).

In the second phase, either belief propagation decoding is applied to the unknown variables that are not permanently inactivated using belief propagation decoding described previously, or OTF inactivation decoding is applied to the unknown variables that are not permanently inactivated, similar to that described for first phase of the OTF inactivation decoding method.

In a third phase, the permanently inactivated variables together with any additional OTF inactivated variables generated in the second phase using OTF inactivation decoding are solved for, for example using Gaussian elimination, or, if it exists, a special structure of the relationships between the permanently inactivated variables and the linear equations is used to solve more efficiently than by using Gaussian elimination.

In a fourth phase the values of the solved for inactivated variables, either OTF inactivated variables or permanently inactivated variables, are used to fully solve for the variables associated with the equations during the second phase of decoding.

Decoding Using Permanent Inactivation

One of the advantages of permanent inactivation decoding methods is that the number w of OTF inactivations other than the permanent inactivations can be generally small or zero and can be largely independent of which output symbols are received. This can make the decoding complexity consistently small independent of which output symbols are received, allow more reliable decoding, and allow more predictable and fewer memory accesses which can be more efficiently scheduled. Because there are only a small number of OTF inactivations in the second phase, and because OTF inactivations in the second phase are generally only revealed during the decoding process which can make the pattern of symbol operations somewhat unpredictable, the memory access patterns are more predictable during decoding, overall allowing more predictable efficient decoding processes.

There are many variants of the above. For example, the phases may be executed in non-sequential interleaved order. As another example, the inactivated symbols may in turn be solved for using either OTF inactivation decoding or permanent inactivation decoding. As another example, permanent inactivation decoding may be applied to linear system of equations and variables that may be used for error-correcting codes, or erasure correcting codes, or for other applications that can be solved using linear systems of equations. As another example, these methods can be applied to both systematic codes and to non-systematic codes. As another example, these methods can also be applied during an encoding process, for example when encoding using the methods taught in Shokrollahi III for generating systematic codes from non-systematic codes.

In some cases, it is possible to design the encoding process so that permanent inactivation decoding methods will be especially effective. For example, belief propagation decoding is known to be very computationally efficient whenever it can be applied, but it is also known that it cannot provide high reliability decoding when used alone. When belief propagation decoding is used within OTF inactivation decoding, the belief propagation steps can be processed very efficiently, but the OTF inactivation steps interspersed within the belief propagation steps can slow down decoding, and the more such OTF inactivation steps there are the slower is the decoding process.

In typical embodiments of OTF inactivation decoding, when trying to solve for k unknown variables using n linear equation values, the number of OTF inactivation steps is typically largest when n=k, i.e., when trying to solve the variables using zero reception overhead. On the other hand, as n grows larger than k it is typically the case that the complexity of OTF inactivation decoding decreases due to fewer OTF inactivation steps, until when n is large enough there are in some case no OTF inactivation steps and inactivation decoding is as or nearly as computationally efficient as belief propagation decoding. In other embodiments of OTF inactivation decoding, the number of OTF inactivations may remain large even when n is considerably larger than k.

In one preferred embodiment of permanent inactivation decoding, the number t of permanently inactivated variables and the structure of the linear equations is designed so that when solving for the k−t variables that are not permanently inactivated using OTF inactivation decoding from k values of linear equations, the number of OTF inactivation steps during OTF inactivation decoding is small and in some cases zero, and thus the OTF inactivation decoding step is nearly as computationally efficient as belief propagation.

In preferred embodiments, the structure of the linear equations is designed such that the OTF inactivation decoding phase is nearly as efficient as belief propagation decoding. In such preferred embodiments, the relationships of the permanently inactivated variables to the linear equations is such that the phase of solving for the inactivated variables, comprised of the permanently inactivated variables together with any OTF inactivated variables from the OTF inactivation decoding phase, can be performed efficiently. Furthermore, in preferred embodiments the structure of the permanently inactivated symbols is such that the phase of completing the solution of the variables that are not inactivated from the solved inactivated variables is computationally efficient.

As a concrete example of such a code construction, the value of t could be set to $c \cdot \sqrt{k}$ for some appropriate constant c, where k is the number of input symbols, and then the methods described in Luby I could be used to construct a code that with high probability successfully decodes using belief propagation decoding in the first phase when solving for the k−t input symbols that are not permanently inactivated from k received output symbols. In addition, the code could be augmented so that in a preprocessing step a number X of random or pseudorandom or deterministically constructed linear combinations of the k input symbols could be computed to produce X redundant symbols.

At the encoder, each output symbol can be chosen to have neighbors among the k−t input symbols that are not permanently inactivated using degree distributions as described in Luby I, and have c' neighbors among the X redundant symbols, where c' is an appropriate constant, e.g., c'=4 or c'=1. In addition, the number of neighbors of each output symbol among the X redundant symbols can come from a degree distribution that can be different from the degree distribution chosen for the generation of the neighbors of the output symbol among the k−t input symbols that are not permanently inactivated. Then, each output symbol can be computed as the XOR of the values of its neighbors.

At the decoder, after having received N output symbols, where typically N≧k, the t input symbols could be declared to be permanently inactivated, belief propagation is used to "solve" for the k−t input symbol that are not permanently inactivated (not fully solved, due to their dependence of these output symbols on the permanently inactivated symbols), then solve for the values of the t permanently inactivated symbols, then use these t solved permanently inactivated symbols to complete the solution of the k−t input symbols that were not permanently inactivated.

Chain Reaction Codes and Permanent Inactivation

In one particular embodiment of chain reaction codes, to reduce the computational complexity of the decoding process, while maintaining (or even diminishing) the failure probability, a permanent inactivation decoding embodiment can be used. As before, k is the number of source symbols, l is the number of LDPC symbols and h is the number of HDPC symbols. As before, t refers to the number of permanently inactivated input symbols, which in this embodiment is a number smaller than k. The number t, and possibly the indications of which t of the input symbols are permanently inactivated, is input to the encoder and decoder. The static encoder generates l LDPC symbols, using the value of k−t as the number of input symbols. The encoder also generates h HDPC symbols over the field GF(256). The source vector is, in this case, $x=(x_1, \ldots, x_k)$. The encoder might choose l "random" or "pseudorandom" binary vectors $v_1, \ldots, v_l$ of length t and h random or pseudorandom vectors $u_1, \ldots, u_h$ of length t over the field GF(256) and find vector y and z of lengths l and h, respectively, such that the equation expressed in FIG. 10 is satisfied.

In FIG. 10, C and H can be the matrices that are used in an OTF inactivation encoder/decoder. $I_l$ and $I_h$ denote identity matrices of sizes l and h, respectively. It should be noted that the number of rows l of C is calculated from the number k−t of source symbols, and not k in this particular embodiment. This can be done using many different methods.

The generation of output symbols is slightly different in this new setting. As before, output symbols are generated from the vector (x|y|z). In this setting, this vector is subdivided into two parts, a vector $X_1$, comprising the first k+h+l−t entries, and vector $X_2$ comprising the last t entries, as shown in Equation 9.

$$(x|y|z)=(X_1 X_2) \quad \text{(Equ. 9)}$$

For every output symbol ω generated, a chain reaction code might be used with a given output degree distribution applied to the vector $X_1$ at the same time, a random chain reaction code is applied to the vector $X_2$, and the results of these two operations are XORed to produce the final output symbol. In operation, the random chain reaction code might be replaced by a pseudorandom code that is very fast to compute. The instantiation of the random chain reaction code applied to ω is a t-bit vector denoted by μ(ω).

On the decoding side, assume that the decoder has collected N output symbols denoted $s_1, \ldots, s_N$. The corresponding μ-vectors are denoted by $\mu_1, \ldots, \mu_N$, so that $\mu_i = \mu(s_i)$. The decoder sets up a system of linear equations as shown in FIG. 11.

Note that disregarding the last t columns of the matrix in FIG. 11 gives a matrix that is exactly the same as in the case of the OTF inactivation decoding described in Shokrollahi II. However, for the same number of received output symbols there are relatively less input symbols to recover using OTF inactivation decoding, because some of the input symbols are permanently inactivated (and thus not recovered using OTF inactivation decoding), than when permanent inactivation decoding is not used. As a result, the OTF inactivation width of the matrix in FIG. 11 is smaller, and the rank profile of the matrix is better (i.e., the matrix has a high probability of being full rank), using permanent inactivation decoding than if only OTF inactivation decoding were used. Furthermore, the addition of the last t random columns will have the effect that the entire matrix looks more like a random matrix, leading to a high probability that the t permanently inactivated symbols will be solvable, and thus the entire decoding process will succeed using permanent inactivation decoding.

Fast Computation of the Permanently Inactivated Symbols

From a computational point of view, μ(ω) preferably is not a purely random vector. In this section, we introduce a different embodiment that will produce pseudorandom vectors with better computational properties.

In this embodiment, we choose, for consecutive output symbols $\omega_1$ and $\omega_2$, the vectors $\mu(\omega_1)$ and $\mu(\omega_2)$ in such a way that the Hamming distance W between these vectors is small, say something between 1 and 4. This way, if the decoder has the linear combination of the permanently inactivated input symbols for the vector $\mu(\omega_1)$, it can calculate the same for the vector $\mu(\omega_2)$ by performing W additional XOR operations.

This is the same methodology as was used in previous embodiments for the computation of HDPC symbols, for example as taught in Shokrollahi IV, but there the method of choice was the binary reflected Gray code, and the relative Hamming distance between two consecutive vectors was 2. This method is, however, not preferable in our case, due to the following: the inactivation width t is usually much smaller than $2^{N+1}$, where N is the number of output symbols. Thus, the effect is that the changes tend to be in only a small part of the t coordinate positions of the vector μ(ω), and thus we choose a different method.

Fix the number W, and set $T=t^W$. In a first step, we choose a number B with $t^{W-1} < B < t^W$ and gcd(B,T)=1. For the first output symbols $\omega_1$ we choose $\mu(\omega_1)$ as the vector having ceil(t/2) 1's followed by floor(t/2) 0's. Thereafter, to calculate the positions in which $\mu(\omega_i)$ and $\mu(\omega_{i+1})$ differ, we proceed as follows: we calculate $c_i = (i+1) \cdot B \mod T$ and write it in its t-ary expansion as shown in Equation 10.

$$c_i = a_0 + a_1 \cdot t + \ldots + a_r \cdot t^{W-1} \quad \text{(Equ. 10)}$$

The positions in which the two vectors $\mu(\omega_i)$ and $\mu(\omega_{i+1})$ differ are then $a_0, \ldots, a_r$. If some of these positions are the same, we skip the repetitions, so that the actual Hamming distance between these consecutive vectors is at most W (though it is W in most cases).

Fast Decoding

If the loss rate is p, then decoding with a number of XOR of symbols is roughly as shown by Equation 11, where Π is the number of symbol operations used for inactivation decoding for a code with k–t source symbols, and k/(1–p) output symbols generated and sent, and w is the inactivation width of this code. Note that the running time behavior of the decoder relatively modest if the loss rate p is not too close to 1.

$$\frac{k \cdot W}{1-p} + l \cdot W + t^2 + w \cdot t + \Pi \quad \text{(Equ. 11)}$$

Let M denote the total number of output symbols sent; further, let $\tau_1, \ldots, \tau_l$ denote the vectors describing the contribution of the permanently inactivated symbols to the LDPC symbols. Further, let $\tau_{l+1}, \ldots, \tau_{l+M}$ denote the vectors describing the contribution of the permanently inactivated symbols to the M generated output symbols. Let $\tau_1$ be a pseudorandom vector of size t (which we can, for example, choose to be the vector comprising ceil(t/2) ones followed by zeros). The vectors $\tau_2, \ldots, \tau_{l+M}$ have each a Hamming distance of W to their respective predecessors.

Suppose that the decoder collects the output symbols $s_1, s_2, \ldots, s_N$ with indices $i_1, i_2, \ldots, i_N$ so that the relationship between the source symbols, the LDPC symbols, the HDPC symbols, and the collected output symbols is as described in FIG. 11. The permanent inactivation method can transform the decoding matrix by row and column permutations into a matrix of the form shown in FIG. 12(a), where L is a lower triangular matrix, S is a matrix of width w, A is a matrix defined over GF(2), and B is a matrix defining the HDPC symbols, v is a permutation of the vector transpose (x|y|z) according to the column permutations of the matrix on the right hand side of FIG. 11, and u is a permutation of the vector on the right hand side of FIG. 11 according to the row permutations of the matrix in that figure. The sequence $(j_1, \ldots, j_{N+l})$ is a permutation of the sequence $(1, 2, \ldots, l, i_1, i_2, \ldots, i_N)$. After an elimination step, the matrix L is transformed to the identity matrix, and the part of the matrix A (and B, if necessary) below L are zeroed. The same sequence of operations also transforms the vector u comprising the received output symbols and zeros. The new vector obtained from u is denoted q in FIG. 12(b). The part below S and the part comprising the last t columns give rise to a matrix V, which, in case of successful decoding, has rank t+w. Solving this matrix will yield the values of the OTF inactivated input symbols corresponding to the columns of S, and the values of the permanently inactivated symbols. One of the many ways to recover the values of the input symbols that are neither OTF inactivated nor permanently inactivated is to calculate, on each row of the matrix obtained from the first b rows and last t+w columns of the matrix in FIG. 12(b), the combination of the values of the inactivated symbols according to that row, to obtain the value of the input symbol according to that row of the matrix.

Though useful in some applications, this method leads to a large computational overhead in a number of preferred embodiments, since for every non-inactivated input symbol a number of XORs has to be performed which is proportional to w+t. This can put severe limitations on the size of t, the number of permanently inactivated symbols, which in effect will lead to an increase in the number w of OTF inactivated input symbols.

A different method is now described that is called "sparse decoding" and alleviates many of the computational problems associated with the previous method. Referring again to FIG. 12(b), the values of the inactivated (OTF or permanent) input symbols are calculated by performing a Gaussian elimination (or more efficient decoding methods, if possible) on the matrix V. Thereafter, the vector q is sub-divided into two parts: a vector $q_1$ comprising the first b symbols of q, and a vector $q_2$ comprising those k+l+h−b symbols that were used to obtain the values of the inactivated symbols. The other symbols in q (if any) are discarded.

Analogously, the vector v is subdivided into two parts: a vector $v_1$ comprising the b non-inactivated input symbols, and a vector $v_2$ comprising the inactivated input symbols. The values of the latter vector have been determined at this point.

The system of equations associated to these new vectors is described in FIG. 12(c). Next, the matrix L from FIG. 12(a) is multiplied with the vector $q_1$ and with the matrix in FIG. 12(c). In operations, this means that the decoder "re-encodes" the vector $q_1$ according to the matrix L. This can be done in a variety of ways, under consideration of computational, storage, and other resources, as described in Luby III. After this step, the vector $q_1$ is transformed to another vector $q_3$, and the system of linear equations describing the connection between $v_1$, $v_2$, and $q_3$ is given in FIG. 12(d). The quantities on the right-hand side are all known. For the multiplication of the matrix on the right-hand side with $v_2$, it is possible to first calculate the product of S and $v_2$ and then the product of the vectors $\tau_{j,r}$ with $v_2$, which can be done by first calculating the product of $\tau_{j,r}$ with $v_2$ and for the other $\tau_{j,r}$ modify the result of the previous multiplication in as many positions as the Hamming distance between $\tau_{j,r}$ and $\tau_{j,r-1}$ as described previously.

In other words, the decoder starts with the XOR $\tau_{j1}$, and continues from that to calculate, one-by-one, the XORs $\tau_{j2}, \ldots, \tau_{jb}$ using a number of XORs which is b times the average Hamming distance between consecutive vectors $\tau_{j,r}$. Once the right-hand side of FIG. 12(d) is calculated, the missing values of $v_1$ are obtained by solving a lower-triangular (and sparse) system of equations. For this, various methods can be used, for example those taught in Luby III.

Next, we will give a very rough estimate of the number of XORs that this method uses.

After the first and second phase, a straightforward implementation of a third phase that computes the values of the t permanently inactivated symbols and the w OTF inactivated symbols using Gaussian elimination uses roughly $(t+w)^2/2$ symbol operations to solve for the values of the t+w permanently inactivated and OTF inactivated symbols, since the inverse matrix will have roughly $(t+w)^2/2$ non-zero entries. The fourth phase can be partitioned into two steps, wherein the first step is to calculate the right-hand side of FIG. 12(d), and the second phase is the calculation of the vector $v_1$. At a loss rate of p, the average Hamming distance between two consecutive vectors $\tau_{j,r}$ is W/(1−p), so that that the average cost of calculating the right-hand side of FIG. 12(d) is b(w+W/(1−p)+1) XORs. The second part of the fourth step, which corresponds to solving for the unknown vector $v_1$, uses roughly cb operations, wherein c is a constant (typically close to the average output degree of the LT-code used). This gives an average total XORs as shown by Equation 12 to obtain the values of input symbols, once the system of equations is transformed to the form given in FIG. 12(b).

$$\frac{(t+w)^2}{2} + b(w + W/(1-p) + 1) + cb \quad \text{(Equ. 12)}$$

With some code designs the value of w is very small, and W is one, so that a good estimate for the additional number of operations is $dt^2+b(1(1-p)+c)$ for some small constants d and c. The above estimates are acceptable for some application where the amount of loss p is known to be below a certain threshold, for example $p \leq \frac{1}{2}$.

In applications where the chain reaction code is to be used in a variety of loss conditions, or when the amount of loss that the chain reaction code is going to be used with is unknown, a preferred embodiment uses a different construction for the permanently inactivated symbols. As is appreciated by those of skill in the art, one of the main properties of the matrix obtained by stacking, one below another, the vectors corresponding to the permanently inactivated symbols, is that this matrix has the same rank as t, and that this is true for most of the sub-matrices of this matrix formed by a sufficiently large number of rows. Such a property holds for example for a suitably chosen method in which each of the vectors describing the dependency of dynamic or static output symbols on the permanently inactivated output symbols has exactly one entry equal to one, and all other entries equal to zero. One such preferred embodiment is described in full detail in Appendix A. In this case, the last formula given above becomes $dt^2+bc$. This means that if t is chosen to be on the order of the square root of k, then the expected number of operations is a number that is proportional to k.

Memory Optimization

In some implementations, the decoder can accomplish the decoding without storing the permanently inactivated part of the decoding matrix. This may be possible (unlike the OTF inactivation part), since the permanently inactivated part is known ahead of time and the differences of rows of this matrix are not large.

Specific Example Implementation with Code

Without permanent inactivations (i.e., predetermined decisions as to which encoded symbols would not be part of a matrix manipulation that would be part of determining a sequence for a chain reaction decoding), the number of OTF inactivations might be quite random and cause potential problems in terms of memory consumption. Where the number of source symbols is very large and the overhead is very small, the error probability can be unacceptably close to 1.

Because of the high error probability for small overheads, it can become increasingly difficult to find good systematic information when the number of source symbols is large. Herein, systematic information refers to information needed to provide to the encoder and decoder in order to be able to construct a systematic code in the sense of Shokrollahi III. Moreover, whenever systematic information is obtained, it is to be expected that the behavior of the code is very far from its average behavior, because on "average" the code should fail at zero overhead.

It is informative to look at the decoding matrices before and after the elimination, as shown in FIG. 13, in the OTF inactivation method. FIG. 13(a) shows a decoding matrix of for OTF before elimination. The HDPC and LDPC rows are terminated by identity matrices of appropriate sizes. The LDPC rows are zero above the identity matrix corresponding to the HDPC rows. FIG. 13(b) shows the decoding matrix after elimination, up to row/column permutation. The last columns correspond to the inactivated input symbols. The rank deficiency of the decoding matrix equals that of the highlighted matrix in the lower right corner.

As is shown in FIG. 13(b), after the elimination step the decoding matrix has a block upper triangular form (up to row/column permutations). The upper left block is an identity matrix, and the lower right block is a somewhat dense matrix obtained from the inactivated columns, and the HDPC rows. The rank deficiency of the entire matrix is dictated by that of the lower right matrix. The HDPC symbols help reduce the rank deficiency of this matrix. They need to be eliminated from all the non-inactivated columns to obtain the form given in FIG. 13(b).

Declaring some pre-determined number of the columns as inactive before the decoding even starts, thus introducing "permanently inactivated" columns (or input symbols) can lead to a surprisingly large array of improvements in several dimensions. For one, the computational complexity of the decoder is reduced, much lower error probabilities occur, very low error probabilities even for zero overhead, and better management of the inactivated symbols is permitted.

FIG. 13(c) and FIG. 13(d) illustrate the effects of permanently inactivated symbols (the "permanently inactivated" method).

FIG. 13(c) is the decoding matrix before elimination and FIG. 13(d) is the decoding matrix after elimination, up to row and column permutations. The rank deficiency of the matrix in the lower right corner is influenced by whether or not the matrix A is full rank.

The decoder populates the rows of the permanently inactive columns of the matrix pseudorandomly, but in a manner that allows efficient computation of the product of the permanently inactive matrix with a vector. Moreover, it populates the HDPC part of the decoding matrix with pseudorandom elements in GF(256) so that the product of this matrix with a vector can be calculated efficiently.

For this, the decoder can follow the same strategy as shown by examples in Shokrollahi II. After the elimination step, the matrix is (up to permutation of rows and columns) given in FIG. 13(d). It is possible that the matrices B and A behave like random binary matrices, whereas the HDPC part behaves like a random matrix over GF(256).

Other parameters include the degree distribution $\Omega$ used for the chain reaction code, the number and structure of the LDPC symbols, the number and structure of the HDPC symbols, and/or the number and structure of the permanently inactivated symbols.

In an example chain reaction code, the weight or degree distribution is given by the following polynomial of Equation 13.

$$\Omega(x) = 0.005x + \sum_{i=2}^{29} \frac{x^i}{i(i-1)} + (1.0/29 - 0.005)x^{30}. \quad \text{(Equ. 13)}$$

The number, t, of permanently inactivated symbols can be chosen to be equal to $t=\text{ceil}(\sqrt{10k})$, where k is the number of source symbols. The structure of the non-HDPC part of the permanently inactivated symbols is exemplified in FIG. 14 for the case t=10. In FIG. 14, the numbers to the left are the values of the current ESI modulo t, and the lines on the right of those numbers correspond to the rows of the permanently inactive matrix for that particular ESI. Herein, the ESI refers to the "Encoding symbol ID" which is a unique key associated with every dynamic and static output symbol, and is further described in Shokrollahi IV. In preferred embodiments, the ESI is an integer in some predetermined range of integers, for example the range $0 \ldots 2^{16}-1$, or $0 \ldots 2^{32}-1$.

The number of HDPC symbols used for permanent inactivation decoding methods is generally smaller than the corresponding number used for OTF inactivation decoding methods, though as in the case of OTF inactivation decoding methods, this number can depend on the number of source symbols. The exact formula can be as follows: if h denotes the number of HDPC symbols, and t denotes the number of permanently inactivated symbols, then h=5+floor(5(k−t−1000)/49000).

Examples of program code follow, but it should be understood that implementations are not limited to these examples.

In the first part of a decoder process, the decoder calculates basic parameters from the parameters SrcBlkSize (size of the source block in bytes), and SymbolSize (size of a symbol):
 1. nSrcSym which is the number of source symbols,
 2. nPISymbols which is the number of permanently inactivated symbols,
 3. nLDPC which is the number of LDPC symbols,
 4. nHDPC which is the number of HDPC symbols,
 5. nInp which is the number of input symbols,
 6. nP which is the smallest prime greater than or equal to nInp.

Example code that might be executed by a processor implementing the decoding process is shown in FIG. 15.

For the encoding operation, assume a source subdivided into nInp symbols. These symbols are denoted Src[0], . . . , Src[nInp−1], Src[nInp], Src[nSrcSym−1], respectively. For a given Encoding symbol ID (ESI), which is an integer in some range, the task of the encoder is to calculate a unique symbol Symb. The procedure makes use of an external procedure, called ESIToTriple which creates from the ESI a triple (a,b,w) where a and b are integers modulo nP, a an integer not divisible by nP, and a positive integer w. There are two more external procedures, called FirstNgbr and NextNgbr. FirstNgbr(a,b,w) calculates the first input symbol neighbor of the symbol Symb, whereas NextNgbr(a,b,w,j) calculates the next neighbor of the Symb following just after neighbor j. There are altogether w neighbors.

The initializer for the encoder computes a list H[0], . . . , H[nPISymbols] of additional symbols which are then used for the actual encoding. H[0] is the XOR of the symbols Src[nInp+2i+1], where i=0, 1, . . . , floor(nPISymbols/2)−1. For I≧1, we have H[i]=H[i−1]⊕Src[nInp+i−1]. FIG. 16 shows an encoder initialization method. The encoder will make use of the values precomputed in FIG. 16. FIG. 17 shows an Encode method.

The initial steps of the decoding comprises a scheduler, and a decoder. Both modules take into account the additional permanently inactivated input symbols.

The task of the scheduler is the computation of a decoding schedule from a list E[0], . . . , E[nDynamic−1] of the ESIs of the collected output symbols.

One difference of permanently inactivated decoding relative to OTF inactivation is the existence of the permanently inactivated symbols. Contrary to the inactivations happening later in the scheduling process, these inactivations are known at the start of the scheduling, and are taken into account by initializing the inactivation matrix InactMat accordingly. This is a matrix with nOut:=nDynamic+nLDPC+nHDPC rows and nPISymbols+w columns, where w is the number of OTF inactivations (which is not known a-priori). Rows 0, . . . , nDynamic−1 of this matrix correspond to the received symbols, whereas rows nDynamic, . . . nDynamic+nLDPC−1 and rows nDynamic+nLDPC, . . . , nOut−1 correspond to the LDPC and the HDPC symbols, respectively.

Let x denote the vector (0, 1, 0, 1, . . . , 0, 1) of length nPISymbols. (The last bit is 0 if nPISymbols is odd.)

The initialization of InactMat is shown in FIG. 18. An example of the matrix InactMat is shown in FIG. 19 for the case nPISymbols=10. In FIG. 19, the leftmost integers give the values of ESI, and the underlined entries prefixed indicate the positions in which the coordinate positions have changed compared to the previous row.

The general scheduling method comprises various steps, wherein each step operates on a graph formed between the output symbols, LDPC and HDPC symbols on the one side, and the input symbols on the other side.

In the first step, a structure called the "ripple" is formed from the received output symbols. This structure is typically implemented as a priority queue, and contains at any given point a list of indices of output symbols of reduced degree one; priority is given to those output symbols whose original degree was smallest at the start of the process. The main loop of the scheduler discharges the top element of the ripple, and uses the routine RemoveUniqueNeighbor( ) to remove the unique neighbor of that output symbol. If the ripple is empty, an attempt is made to OTF inactivate an input symbol using the routine Inactivate( ) thereby leading to new elements in the ripple. Each step processes one input symbol, marking it as "recovered" or "inactive," wherein the attribute "recovered" refers to the fact that the value of this input symbol can be recovered once the values of the inactivated input symbols have been obtained.

The scheduler then continues to process all the remaining output, LDPC, and if necessary also HDPC symbols, and solve a system of linear equations to recover the values of the inactivated symbols.

The stopping criterion of the loop above is based on some variables. The loop maintains variables nRecovered for the number of recovered input symbols, and nInactive for the number of inactivated input symbols. A method for calculating a schedule is shown in FIG. 20.

A procedure RemoveUniqueNeighbor( ) finds the unique input symbol connected to output symbol with index OSIndex, and removes it from the graph. The index of this input symbol is denoted by ISIndex. In theory this would mean that all the neighbors of ISIndex are visited, and their link to ISIndex is explicitly terminated. A special data structure can be used to make this step more efficient.

At the end of the scheduling process the decoder has recovered, among other things, the following parameters:

1. An integer Recovered, which gives the number of directly recovered input symbols.

2. An array OSOrder of length Recovered, which gives an ordered list of the output symbols that directly recover some input symbols.

3. An array InpOrder, which gives an ordered list of input symbols that were directly recovered. Note that InpOrder[i] is recovered by OSOrder[i] for i=0, . . . , Recovered−1. The array InpOrder may be implicitly defined, for example through the data structures designed for the output and the input symbols.

4. A list InactList of nInactive indices of the inactivated input symbols in the order of their inactivation. The permanently inactivated input symbols appear first in this list, with their indices given by nInp, nInp+1, . . . , nInp+nPISymbols−1.

5. A square matrix, M, with nInactive rows and columns, and a list rowmask of length nInactive such that the inactivated symbols denoted by $\tau_0$, K, $\tau_{Inactive-1}$ satisfy the relations shown in Equation 14.

$$\begin{pmatrix} \tau_0 \\ \tau_1 \\ \vdots \\ \tau_{Inactive-1} \end{pmatrix} = M \cdot \begin{pmatrix} z_{rowmask[0]} \\ z_{rowmask[1]} \\ \vdots \\ z_{rowmask[Inactive-1]} \end{pmatrix} \qquad \text{(Equ. 14)}$$

The first nPISymbols inactivated symbols are the permanently inactivated ones, i.e., they are the source symbols with indices nInp, nInp+1, . . . , nInp+nPISymbols−1. The next nInactive−nPISymbols inactivated symbols are the additional input symbols that were inactivated in the course of the scheduling, i.e., the OTF inactivated input symbols. Accordingly, the first nPISymbols columns of the inactivation matrix InactMat correspond to the permanently inactivated symbols, whereas the last nInactive−nPISymbols columns correspond to the OTF inactivated input symbols.

The goal of the decoder is to recover the source symbols from the set of received symbols using the information provided by the scheduler. The first step of the decoder comprises a forward substitution of the output symbols, as shown in FIG. 21.

The next step of the decoding comprises recovering the values of the input symbol $\tau_0, \ldots, \tau_{Inactive-1}$ using the matrix M described above, as shown in FIG. 22.

This process shown in FIG. 22 does not work in-place as given. However, if the matrix M is given in its PLU-decomposition, then a variant of this process can be made to work in-place.

Once this step is done, the contribution of the additional inactivated symbols is incorporated into the output symbols as shown in FIG. 23.

In the next step, the decoder performs a back-substitution. The effect of this substitution is to bring the inactivation matrix back to its original "sparse" form. This is shown in FIG. 24.

Now, the effect of the permanently inactivated symbols is cancelled. For this, the decoder executes the routine EncoderInitialization( ) above. This is shown in FIG. 25.

At this point, the decoder does another forward pass through the data to almost finish the decoding, as shown in FIG. 26.

Example Hardware Components

Figure 27:
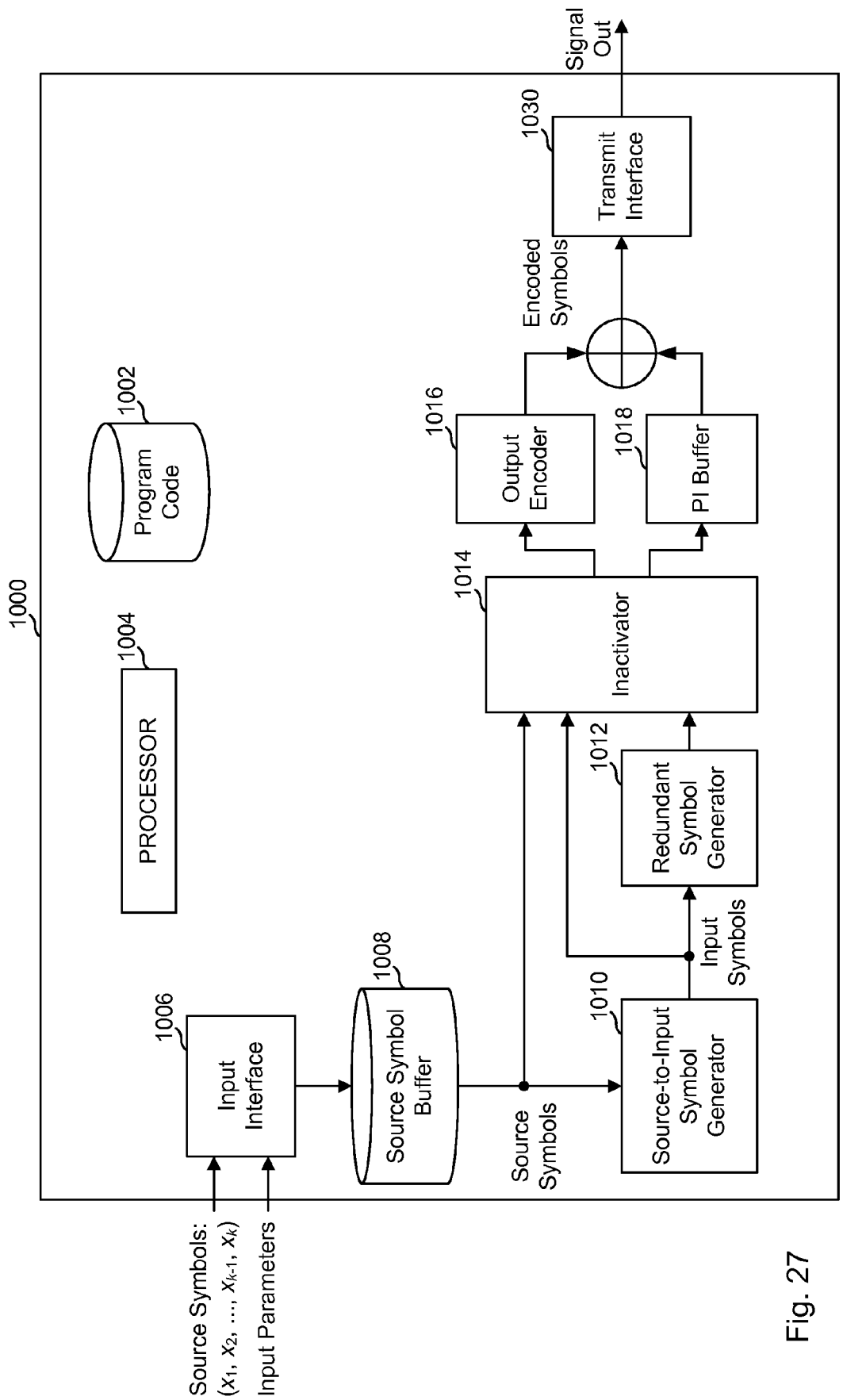
FIG. 27 illustrates overall encoding system.
Figure 28:
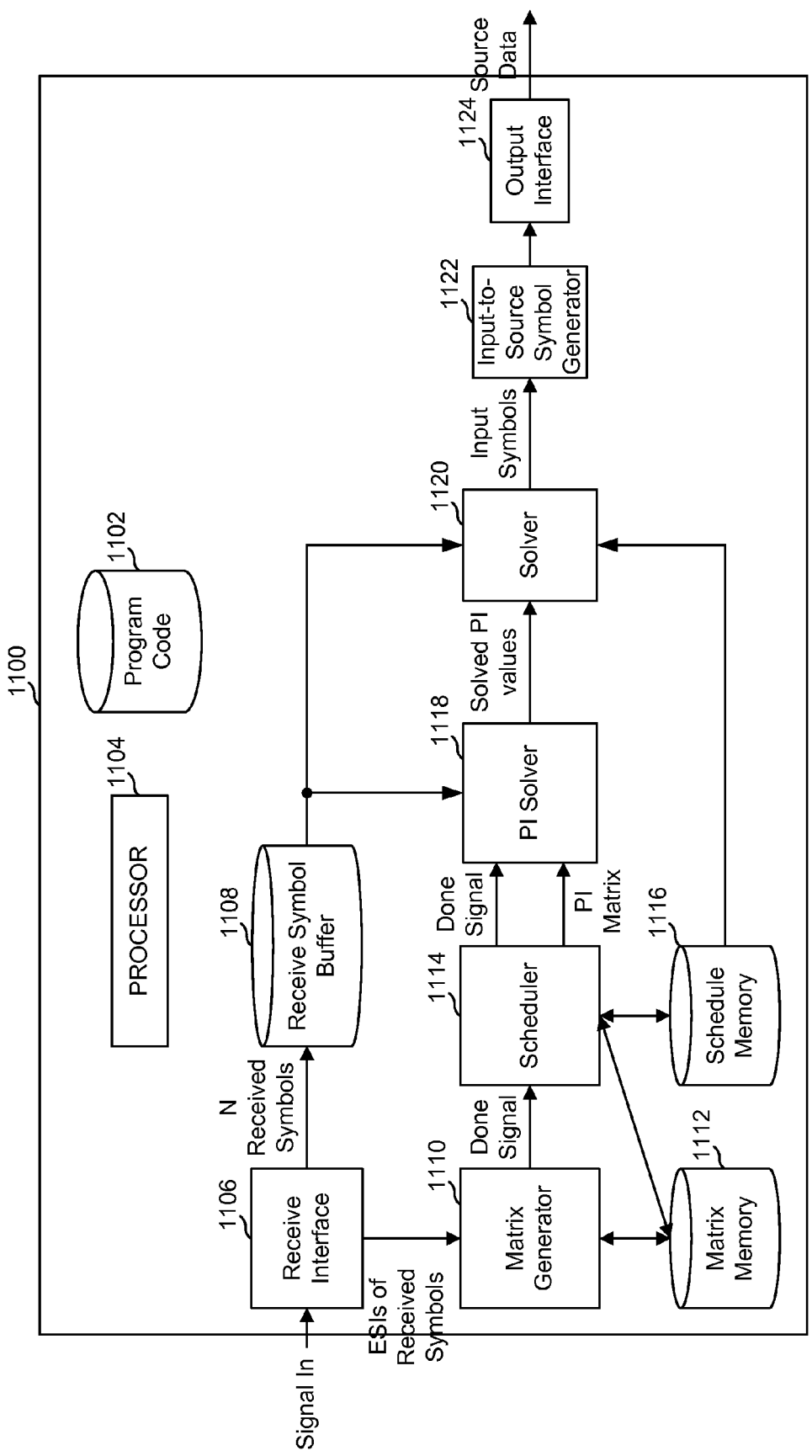
FIG. 28 illustrates overall decoding system.

FIGS. 27-28 illustrate block diagrams of hardware that might be used to implement methods described above. Each element can be hardware, program code or instructions executed by a general purpose or custom-purpose processor or a combination.

FIG. 27 illustrates an example encoding system 1000, that might be implemented as hardware modules, software modules, or portions of program code stored in a program store 1002 and executed by a processor 1004, possibly as a collective unit of code not separated as shown in the figure. Encoding system 1000 receives a signal in, conveying source symbols and parameter information, and outputs a signal conveying that information.

An input input interface 1006 stores the incoming source symbols into a source symbol buffer 1008. A source-to-input symbol generator 1010 generates input symbols from the source symbols. This can be a pass-through in some embodiments and a decoder module in other embodiments (such as a "systematic" embodiment).

A redundant symbol generator 1012 generates redundant symbols from the input symbols. This can be implemented as a chain reaction coder, an LDPC coder, an HDPC coder, or similar. An inactivator 1014 receives the source symbols, input symbols and/or redundant symbols, as the case may be, and stores some of them, the permanently inactivated symbols, in a PI buffer 1018 and provides the others to an output encoder 1016. This process might only be logically, rather than physically.

An operator 1020, such as an XOR operator, operates on one or more output symbols from output encoder 1016 (one, in certain embodiments) and one or more of the PI symbols from PI buffer 1018 (one, in certain embodiments), and the result of the operation is provided to a transmit interface 1030 that outputs the signal from system 1000.

FIG. 28 illustrates an example decoding system 1100, that might be implemented as hardware modules, software modules, or portions of program code stored in a program store 1102 and executed by a processor 1104, possibly as a collective unit of code not separated as shown in the figure. Some process might only be logically, rather than physically, implemented.

Decoding system 1100 takes in an input signal and possibly other information and outputs source data, if it is able to. The signal in is provided to a receive interface 1106 that stores received symbols in a buffer 1108. The ESIs of received symbols is provided to a matrix generator 1110 that generates matrixes as described herein, in dependence on the particular symbols received, and stores the results in a matrix memory 1112.

A scheduler 1114 can read matrix details from matrix memory 1112 and generates a schedule, stored in a schedule memory 1016. Schedule 1114 might also generate a done signal and convey a PI matrix to a PI solver 1118 when complete. PI solver 1118 provides solved PI symbol values to a solver 1120, which also used the schedule, to decode the input symbols from the received symbols, schedule and PI symbols.

The input symbols are provided to an input-to-source symbol generator 1122, which could be an encoder or pass-through. The output of input-to-source symbol generator 1122 is provided to an output interface 1124 that outputs the source data, or what source data is available for output.

Decodability Variations

In certain situations, there might be a need for enhanced decodability.

1) Including PI Neighbors for LDPC Symbols

In examples provided elsewhere herein, while encoded symbols had both LT neighbors and PI neighbors, the LDPC symbols only had LT neighbors or PI neighbors that were not amongst the HDPC symbols. In some instances, decodability is improved if LDPC symbols also have PI neighbors that include the HDPC symbols. With neighbors amongst all of the PI symbols, including the HDPC symbols, the decoding worth of the LDPC symbols might be more similar to that of the encoded symbols. As explained elsewhere herein, symbols that depend on the LT symbols (which can be easy to encode and decode) and also depend on the PI symbols, including the HDPC symbols (which can provide high reliability decoding), so that both advantages might be present.

In an example, each LDPC symbol has two PI neighbors, i.e., an LDPC symbol's value depends on the values of two PI symbols. In a specific implementation, the neighbors may be chosen as described by the following code snippet, where S is the number of LDPC symbols and P is the number of PI symbols including HDPC symbols:

```
For i=0, ..., S-1
    a = i % P
    b = (i+1) % P
    D[i] = D[i] ^ C[W + a] ^ C[W+b]
```

2) Reducing Duplicate Encoded Symbols

Decodability might also be improved, in some situations, reducing the occurrences of duplicate encoded symbols, where two encoded symbols are duplicates if they have exactly the same overall neighbor set, where the overall neighbor set for an encoded symbol is comprised of the LT neighbor set and the PI neighbor set. Duplicate encoded symbols with the same overall neighbor set carry exactly the same information about the intermediate source block from which they were generated, and thus there is no better chance at decoding from having received more than one duplicate encoded symbols then there is from having received one of the duplicate encoded symbols, i.e., reception of more than one duplicate symbol adds to the reception overhead and only one of the encoded symbols amongst the duplicates is useful for decoding.

A preferable property is that each received encoded symbol is not a duplicate of any other received encoded symbol, since this means that each received encoded symbol may be useful for decoding. Thus, it might be preferred to reduce the number of such duplications or reduce the probability of occurrence of duplicates.

One approach is to limit the number of LT neighbors that each encoded symbol can have. For example, if there are W possible neighbors, the maximum number of neighbors might be limited to W−2. This reduces the chance that overall neighborhood sets would be duplicated, in some cases, because the neighborhood set comprising all W possible neighbors would not be allowed. Where the constraint is Deg[v]=min(d, W−2), there are W*(W−1)/2 different neighborhood sets of degree W−2. Thus, it can be less likely that duplicate overall neighbor sets are generated for encoded symbols. Other constraints, such as min(d, W−Wg) for some Wg other than Wg=2, or some other constraint, might be used instead.

Another technique, which can be used alone or with the above duplicate-reducing technique, is to chose more than one PI neighbor for each encoded symbol, so that it is less likely that there are duplicate PI neighbors for encoded symbols, and thus less likely that duplicate overall neighbor sets are generated for encoded symbols. The PI neighbors can be generated in similar ways to how the LT neighbors are generated, for example by first generating a (d1, a1, b1) as shown in the Appendix A, Section 5.3.5.4 according to the code snippet below:

```
if (d < 4) then {d1 = 2 + Rand[y, 3, 2]} else {d1 = 2}
a1 = 1 + Rand[y, 4, P1−1]
b1 = Rand[y, 5, P1]
```

Note that in this example, there is a non-trivial random degree distribution defined on the number of PI neighbors d1 and that distribution depends on the chosen number of LT neighbors d, and the number of PI neighbors is likely to be greater when the number of LT neighbors is smaller. This provides the property that the overall degree of the encoded symbol is such that it reduces the chance that duplicate encoded symbols will be generated and thus received.

The encoded symbol value might be generated using the neighbors defined by (d1, a1, b1) as shown in Appendix A, Section 5.3.5.3, and by the following code snippet:

```
while (b1 >= P) do {b1 = (b1+a1) % P1}
    result = result ^ C[W + b1]
For j = 1,...,d1−1 do
    b1 = (b1+a1) % P1
    while (b1 >= P) do {b1 = (b1+a1) % P1}
    result = result ^ C[W + b1]
    Return result
```

3) Systematic Indices Update

To support these decodability features or separately to provide for decidability, a different systematic index J(K') for values of K' might be used, such as the one shown in Table 2 of Section 5.6 in Appendix A. An example of a process that is performable in a transmission and/or reception system to generate systematic index J(K') is illustrated as follows. For each K' in the list of possible K', one process that could be performed, typically by an appropriately programmed circuit or processor, is to check a number of indices for suitability. For example, the circuit/processor might check, for J=1 . . . 1000 [or some other limit], whether the following criteria are met with respect to possible systematic index J:

(a) Is decoding possible at zero overhead from the K' source symbols? If Yes, record the number of on-the-fly inactivations (b) Are there duplicate overall neighbor sets among the first K'/0.06 possible encoded symbols (with ESIs 0, . . . , K'/0.06)? [Other thresholds might be used instead]

(c) Is the decode failure probability below 0.007 [or some other threshold] when decoding using the first K' received encoded symbols within 10,000 runs [or some other test] when each encoded symbol is lost with probability 0.93 [or some other threshold] in each run independently of the other encoded symbols?

The circuit/processor then chooses among the possible systematic indices J that satisfy criteria (a), (b) and (c) above, choosing the systematic index that recorded the least number of on-the-fly inactivations in step (a).

Note that there are many variations of the above selection criteria. For example, in some cases it might be preferable to choose the systematic index that satisfies (a), (b) and (c) above and yields the fewest number of decode failures in step (c) within the specified number of runs. As another example, a combination of the number of on-the-fly inactivations and the decode failure probability might be taken into consideration when choosing a systematic index. As another example, multiple systematic indices for each K' value might be available, and then one of them is chosen randomly or pseudorandomly within particular applications.

The systematic indices for the K' values listed in Table 2 in Section 5.6 of Appendix A is one potential list of good systematic indices. Table 1 below lists the K' values from Table 2 in Section 5.6 of new Appendix A, together with the number of on-the-fly (OTF) inactivations they have at zero overhead (i.e., using on the K' source symbols) and the decoding failure probability when there is random and uniform 93% encoded symbol loss and when the number of received encoded symbols is exactly K' (zero reception overhead).

TABLE 1

| K' | OTF Inact. | Decode Fail. Prob. |
|---|---|---|
| 6 | 2 | 0.005000 |
| 12 | 2 | 0.004900 |
| 18 | 2 | 0.004700 |
| 26 | 2 | 0.004500 |
| 32 | 2 | 0.004300 |
| 36 | 2 | 0.006000 |
| 42 | 3 | 0.005600 |
| 48 | 6 | 0.006100 |
| 55 | 3 | 0.005800 |
| 62 | 3 | 0.005400 |
| 69 | 3 | 0.005400 |
| 75 | 3 | 0.005600 |
| 88 | 5 | 0.005800 |
| 101 | 4 | 0.005500 |
| 114 | 4 | 0.004700 |
| 127 | 3 | 0.005100 |
| 140 | 5 | 0.004400 |
| 160 | 3 | 0.005100 |
| 185 | 3 | 0.006300 |
| 213 | 2 | 0.004100 |
| 242 | 4 | 0.004300 |
| 267 | 2 | 0.005500 |
| 295 | 3 | 0.005500 |
| 324 | 2 | 0.006500 |
| 362 | 2 | 0.003900 |
| 403 | 4 | 0.004700 |
| 443 | 3 | 0.004400 |
| 497 | 3 | 0.005400 |
| 555 | 4 | 0.006200 |
| 619 | 3 | 0.005200 |
| 685 | 2 | 0.004800 |
| 759 | 2 | 0.005900 |
| 839 | 3 | 0.006200 |
| 932 | 2 | 0.004500 |
| 1032 | 4 | 0.005468 |
| 1144 | 5 | 0.003933 |
| 1281 | 3 | 0.003917 |
| 1420 | 5 | 0.004708 |
| 1575 | 3 | 0.003704 |
| 1734 | 4 | 0.004232 |
| 1906 | 3 | 0.003856 |
| 2103 | 5 | 0.004392 |
| 2315 | 4 | 0.004994 |
| 2550 | 4 | 0.003678 |
| 2812 | 4 | 0.002727 |
| 3101 | 2 | 0.005551 |
| 3411 | 6 | 0.005992 |
| 3751 | 5 | 0.004716 |
| 4086 | 5 | 0.005533 |
| 4436 | 4 | 0.003337 |
| 4780 | 0 | 0.004005 |
| 5134 | 4 | 0.004806 |
| 5512 | 5 | 0.004409 |
| 6070 | 6 | 0.004403 |
| 6688 | 5 | 0.004201 |
| 7360 | 6 | 0.004105 |
| 8087 | 6 | 0.004620 |
| 8886 | 6 | 0.003803 |
| 9793 | 8 | 0.004203 |
| 10779 | 4 | 0.004209 |
| 11864 | 5 | 0.004408 |
| 13046 | 2 | 0.004102 |
| 14355 | 3 | 0.005564 |
| 15786 | 3 | 0.003201 |
| 17376 | 3 | 0.003004 |
| 19126 | 9 | 0.004509 |
| 21044 | 9 | 0.004404 |
| 23177 | 11 | 0.003707 |
| 25491 | 8 | 0.004408 |
| 28035 | 9 | 0.004106 |
| 30898 | 15 | 0.004301 |
| 33988 | 10 | 0.004603 |
| 37372 | 13 | 0.004500 |
| 41127 | 16 | 0.006901 |
| 45245 | 30 | 0.003701 |

TABLE 1-continued

| K' | OTF Inact. | Decode Fail. Prob. |
|---|---|---|
| 49791 | 23 | 0.003602 |
| 54768 | 26 | 0.003039 |
| 56404 | 29 | 0.004402 |

Variations

In some applications, it may be acceptable to not be able to decode all of the input symbols, or to be able to decode all of input symbols, but with a relatively low probability. In such applications, a receiver can stop attempting to decode all of the input symbols after receiving K+A output symbols. Or, the receiver can stop receiving output symbols after receiving less than K+A output symbols. In some applications, the receiver may even only receive K or less output symbols. Thus, it is to be understood that in some embodiments of the present invention, the desired degree of accuracy need not be complete recovery of all the input symbols.

Further, in some applications where incomplete recovery is acceptable, the data can be encoded such that all of the input symbols cannot be recovered, or such that complete recovery of the input symbols would require reception of many more output symbols than the number of input symbols. Such an encoding would generally require less computational expense, and may thus be an acceptable way to decrease the computational expense of encoding.

It is to be understood that the various functional blocks in the above-described figures may be implemented by a combination of hardware and/or software, and that in specific implementations some or all of the functionality of some of the blocks may be combined. Similarly, it is also to be understood that the various methods taught herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method for encoding data to be transmitted over a communications channel that could possibly introduce errors or erasures, wherein source data is represented by an ordered plurality of source symbols and the source data can be recovered from encoded symbols that are transmitted, the method comprising:
   determining encoding parameters including at least a number, K, representing the number of source symbols to be encoded in an instance of encoding;
   generating a plurality of K+R input symbols from at least some of the source symbols;
   determining a number T, representing the number of input symbols that are to be treated as permanently inactivated symbols;
   determining which T symbols of the input symbols are to be designated as permanently inactivated symbols;
   generating output symbols using an encoder that outputs output symbols that are generated based on the K+R−T input symbols that are not designated as permanently inactivated, wherein the generated output symbols can be independent of values of the permanently inactivated symbols; and
   generating an encoded symbol set, wherein each encoded symbol in the encoded symbol set is formed by an operation that takes as operands one of the output symbols and one or more of the permanently inactivated symbols.

2. The method of claim 1, wherein the operation is XOR and the operands are one of the output symbols and one of the permanently inactivated symbols.

3. The method of claim 1, wherein generating a plurality of input symbols from at least some of the source symbols comprises copying the K source symbols as K input symbols and wherein the number R is determined to be zero.

4. The method of claim 1, wherein generating a plurality of input symbols from at least some of the source symbols comprises generating R redundant symbols, wherein value of each of the R redundant symbols depends on values of one or more of the K source symbols, the R redundant symbols and the K source symbols comprising a set of K+R input symbols.

5. The method of claim 4, wherein generating the R redundant symbols comprises:
   generating a number, L, of LDPC symbols based on the source symbols; and
   generating a number, H, of HDPC symbols based on the source symbols and the L LDPC symbols;
   the L LDPC symbols and the H HDPC symbols comprising the R redundant symbols.

6. The method of claim 5, wherein T is at least H and the T permanently inactivated symbols include all of the H HDPC symbols.

7. The method of claim 1, wherein generating the output symbols comprises generating output symbols using a dynamic encoder capable of generating a number of output symbols where that number is independent of K or R.

8. The method of claim 1, wherein generating the output symbols comprises generating output symbols using an encoder capable of generating a number of output symbols that is determined by K.

9. The method of claim 1, wherein generating a plurality of input symbols from at least some of the source symbols comprises:
   applying the K source symbols to a dynamic decoder that is an inverse of a dynamic encoder, the dynamic encoder being capable of generating a number of output symbols where that number is independent of K or R, the applying resulting in a particular set of input symbols.

10. The method of claim 1, wherein generating the output symbols comprises generating a predetermined number of output symbols where the predetermined number is less than the number of possible output symbols and where the predetermined number depends, in part, on K and/or R.

11. The method of claim 1, further comprising transmitting the encoded symbol set.

12. The method of claim 1, further comprising transmitting the encoded symbol set and at least some of the source symbols.

13. The method of claim 1, wherein the input symbols are generated from source symbols in such a way that the output symbols include the source symbols.

14. A method for decoding data that has been transmitted as encoded symbols over a communications channel such that the received data could include errors or erasures compared to what was transmitted, wherein decoded data is to be representative of source data that was encoded and transmitted, the source data being an ordered plurality of source symbols represented by a plurality of input symbols, the method comprising:
   determining which of the encoded symbols were received by a receiver;

determining which of the input symbols correspond to T permanently inactivated symbols;

determining a decoding schedule that would yield a set of T received symbols that have been resolved to depend only on the T permanently inactivated symbols;

applying the decoding schedule to yield the revised values of the T received symbols that depend only on the T permanently inactivated symbols;

solving for the T permanently inactivated symbols using the set of T received symbols with revised values;

determining a decoding schedule that would allow recovery of input symbols using received symbols and the solved for T permanently inactivated symbols, wherein decoding schedule steps include ordering recovery of some input symbols using received symbols and input symbols that would have been already recovered;

applying the decoding schedule to recover the input symbols; and recovering the source symbols from the input symbols as needed.

15. The method of claim 14, wherein the representation of the source symbols by the input symbols is such that the input symbols are comprised of the source symbols and R redundant symbols generated from the source symbols.

16. The method of claim 15, wherein the R redundant symbols are comprised of L LDPC symbols generated from the source symbols and H HDPC symbols generated from the combined set of source symbols and LDPC symbols.

17. The method of claim 16, wherein T is at least H and the T permanently inactivated symbols include all of the H HDPC symbols.

18. The method of claim 14, wherein recovering the source symbols the input symbols comprises copying the input symbols as the source symbols.

19. The method of claim 14, wherein recovering the source symbols comprises generating source symbols using an encoder that is an inverse of a decoder used to generate the input symbols from the source symbols.

20. The method of claim 14, wherein recovering the source symbols from the input symbols comprises:

applying the input symbols to a dynamic encoder that is an inverse of a dynamic decoder used to generate the input symbols, the dynamic encoder being capable of generating a number of output symbols where that number is independent of K or R, the applying resulting in the source symbols.

21. An encoder that encodes data for transmission over a communications channel that could possibly introduce errors or erasures, comprising:

an input for receiving source data that is represented by an ordered plurality of source symbols and encoding parameters including at least a number, K, representing the number of source symbols to be encoded in an instance of encoding;

a source-to-input encoder that encodes the K source symbols into a plurality of input symbols;

an output encoder that encodes the plurality of input symbols according to an output code to form a plurality of output symbols, wherein the output symbols are encoded independent of a subset of a number, T, of the plurality of input symbols that are designated by the encoder, or an input to the encoder, as being permanently inactivated symbols; and an encoded symbol generator that generates an encoded symbol set, each of which that has a property that the encoded symbol is formed by an operation that takes as operands one of the output symbols and one or more of the permanently inactivated symbols.

22. The encoder of claim 21, wherein the operation is XOR and the operands are one of the output symbols and one of the permanently inactivated symbols.

23. The encoder of claim 21, wherein the source-to-input encoder is a pass-through, such that the input symbols are equal to the source symbols, the source-to-input encoder is configured to generate K input symbols, but which are different from the source symbols, or the source-to-input encoder is configured to generate K+R input symbols, where R is a number of redundant symbols generated and a value of each of the R redundant symbols depends on values of one or more of the K source symbols.

24. The encoder of claim 21, wherein the source-to-input encoder is configured to generate a number, R, of redundant symbols such that a value of each of the R redundant symbols depends on values of one or more of the K source symbols, and wherein the source-to-input encoder comprises:

an LDPC encoder module that generates a number, L, of LDPC symbols based on the K source symbols; and an HDPC encoder module that generates a number, H, of HDPC symbols based on the K source symbols and the L LDPC symbols.

25. The encoder of claim 24, wherein T is at least H and the T permanently inactivated symbols include all of the H HDPC symbols.

26. The encoder of claim 21, wherein the output encoder is an encoder capable of generating a number of output symbols where that number is independent of K or R.

27. The encoder of claim 21, wherein the output encoder is an encoder configured to generate a number of output symbols that is determined by K.

28. The encoder of claim 21, wherein the source-to-input encoder is configured such that the output encoder, when it encodes the input symbols, outputs the source symbols, thus forming a systematic code.

29. The encoder of claim 28, wherein the source-to-input encoder comprises a decoder that is an inverse of an encoder present as part of the output encoder that is capable of generating a number of output symbols where that number is independent of K or R.

30. A decoder that decodes data that has been transmitted as encoded symbols over a communications channel such that the received data could include errors or erasures compared to what was transmitted, wherein decoded data is to be representative of source data that was encoded and transmitted, the source data being an ordered plurality of source symbols, the decoder comprising:

an input for receiving encoded symbols;

a generator for generating a decoding matrix based on which encoded symbols were received;

a scheduler for determining an order in which to decode input symbols from the encoded symbols, assuming a number, T, of permanently inactivated symbols were present at an encoder;

a permanently inactivated symbol solver that solves for the permanently inactivated symbols using a matrix that is smaller than the decoding matrix;

a solver that solves for the input symbols given the encoded symbols, the decoding matrix, the order from the scheduler and the solved values of the permanently inactivated symbols; and an input-to-source symbol generator.

31. The decoder of claim 30, wherein the input-to-source symbol generator is a passthrough such that the source symbols are equal to the input symbols.

32. The decoder of claim 30, wherein the input symbols comprise L LDPC symbols generated from the source symbols and H HDPC symbols generated from the combined set of source symbols and LDPC symbols.

33. The decoder of claim 32, wherein T is at least H and the T permanently inactivated symbols include all of the H HDPC symbols.

34. The decoder of claim 30, wherein the source-to-input generator comprises an encoder that is an inverse of a decoder present as part of an encoder that was used to create the transmitted encoded symbols, the encoder being capable of generating a number of output symbols where that number is independent of the number of source symbols or the number of input symbols.

* * * * *